(12) United States Patent
Nakamura et al.

(10) Patent No.: US 6,737,669 B2
(45) Date of Patent: May 18, 2004

(54) SEMICONDUCTOR LIGHT-EMITTING DEVICE

(75) Inventors: Junchi Nakamura, Kashiba (JP); Kazuaki Sasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/304,710

(22) Filed: Nov. 27, 2002

(65) Prior Publication Data

US 2003/0111658 A1 Jun. 19, 2003

(30) Foreign Application Priority Data

Nov. 27, 2001 (JP) ........................................ 2001-360936
Oct. 4, 2002 (JP) ........................................ 2002-292557

(51) Int. Cl.[7] .......................... H01L 29/06; H01L 29/12
(52) U.S. Cl. .............................. 257/10; 257/14; 257/103
(58) Field of Search ............................. 257/10, 14, 103

(56) References Cited

U.S. PATENT DOCUMENTS 5,764,672 A * 6/1998 Ukita et al. .................... 372/45

2002/0179923 A1 * 12/2002 Morita et al. ................ 257/103

FOREIGN PATENT DOCUMENTS

| JP | 4-229665 | 8/1992 |
| JP | 5-335619 | 12/1993 |
| JP | 8-018102 | 1/1996 |
| JP | 9-260724 | 10/1997 |
| JP | 11-087768 | 3/1999 |

* cited by examiner

*Primary Examiner*—David Nelms
*Assistant Examiner*—Tu-Tu Ho
(74) *Attorney, Agent, or Firm*—Morrison & Foerster LLP

(57) ABSTRACT

A semiconductor light-emitting device has a lower clad layer, an active layer, a p-type GaP layer and an upper clad layer, which are successively formed on an n-type GaAs substrate. The p-type GaP layer has a higher energy position by 0.10 eV than the upper clad layer in the conduction band, which makes it more difficult to let electrons escape from the active layer. This contributes to increase of the probability of radiative recombination between electrons and holes in the active layer, and thereby, luminance of the semiconductor light-emitting device is improved. The p-type GaP layer is effective in a semiconductor light-emitting device having a short wavelength in particular.

56 Claims, 11 Drawing Sheets

United States Patent US 6,737,669 B2

SEMICONDUCTOR LIGHT-EMITTING DEVICE

BACKGROUND OF THE INVENTION

The present invention relates to a semiconductor light-emitting device, and in particular, to a semiconductor light-emitting device that employs an AlGaInP-based semiconductor in its light-emitting section.

In order to form a high-intensity semiconductor light-emitting device, it is required to increase the luminous efficiency of its active layer, increase the amount of injection current into the active layer and increase the efficiency of taking out the light emitted from the active layer to the outside of the device.

In order to increase the amount of injection current into the light-emitting section, a current diffusion layer and an intermediate layer or the like capable of improving the amount of injection current without increasing the operating voltage are effective. At the same time, it is required to increase the amount of electrons and holes that contribute to radiative recombination by confining the injected current (electrons and holes) without letting it escape. As a means for confining electrons and holes in the light-emitting layer, a double-hetero (hereinafter referred to as "DH") structure is widely used.

In the DH structure, the active layer is held between semiconductor layers that have a bandgap wider than that of the active layer. Thereby, an energy barrier over which the electrons and holes hardly pass is formed on the upper and lower sides of the active layer, and therefore, the DH structure makes it difficult to let electrons and holes escape. This enables the increase of the probability that the electrons and holes may contribute to the radiative recombination.

The DH structure is widely used also for a semiconductor light-emitting device in which an AlGaInP-based semiconductor is employed in the active layer (refer to Japanese Patent Laid-Open Publication No. HEI 5-335619, page 2, paragraph 0003 and Japanese Patent Laid-Open Publication No. HEI 4-229665, page 2, paragraphs 0003 and 0004).

FIG. 10 shows a prior art semiconductor light-emitting device that has the DH structure.

According to the above-mentioned semiconductor light-emitting device, as shown in FIG. 10, a desired buffer layer 102, an n-AlGaInP clad layer 103, an AlGaInP active layer 104, a p-AlGaInP clad layer 105 and A GaP current diffusion layer 106 are successively laminated on an n-GaAs substrate 101. Further, on the GaP current diffusion layer 106 are successively laminated the other layers of a current blocking layer, a protective layer, an intermediate bandgap layer, a protective layer and so on that are not shown. A p-type electrode 107 is formed on the GaP current diffusion layer 106. An n-type electrode 108 is formed under the n-GaAs substrate 101 by vapor deposition. Subsequently, the n-GaAs substrate 101, the p-type electrode 107, the n-type electrode 108 and so on are formed into the desired shapes so that a semiconductor light-emitting device is completed.

In the above-mentioned semiconductor light-emitting device, a semiconductor having a composition of $(Al_xG_{1-x})_yIn_{1-y}P$ ($x\approx0.7$ and $y\approx0.5$) is employed for the n-type clad layer 103 and the p-type clad layer 105. However, in the general semiconductor light-emitting device of the AlGaInP-based semiconductor, a semiconductor having a clad layer composition of $(Al_xGa_{1-x})_yIn_{1-y}P$ ($0.7\leq x\leq 1.0$, $y\approx0.5$) is often employed.

FIG. 11 shows a band profile in the vicinity of the active layer of the prior art semiconductor light-emitting device.

As shown in FIG. 11, the upper and lower clad layers have a bandgap wider than that of the active layer, and therefore, an energy barrier is formed on both outer sides of the active layer. This arrangement restrains the phenomenon that the electrons and holes injected into the active layer escape from the active layer to the outside, i.e., overflow. As a result, there increases the probability of radiative recombination of electrons and holes in the active layer, and this allows a high-intensity semiconductor light-emitting device to be obtained.

In the above-mentioned prior art example, the DH structure has been used as a method for confining a large number of electrons and holes injected from the outside of the device in the active layer. However, in a device that has a short wavelength of light emitted from the active layer, the bandgap of the active layer is widened, and the difference in the bandgap between the active layer and the clad layer is reduced.

As described above, if the bandgap difference between the active layer and the clad layer is reduced, then the energy barrier against electrons and holes is reduced. As a result, the effect of confining electrons and holes produced by the clad layer is reduced, and therefore, the electrons and holes easily escape from the active layer. That is, the electrons and holes easily overflow from the active layer. For the above-mentioned reasons, there have been the problems that the luminous efficiency has been reduced in the short-waveform semiconductor light-emitting device and a high-intensity semiconductor light-emitting device has hardly been unable to be obtained.

With regard to electron and hole, it is difficult for hole to overflow since hole has a low mobility, whereas it is easy for electron to overflow since electron has a mobility several tens of times higher than that of hole.

In concrete, with regard to the AlGaInP-based semiconductor light-emitting devices, the overflow does not matter in a device that has an emission wavelength longer than 590 nm, whereas the overflow becomes significant in a device that has an emission wavelength of not greater than 590 nm. This overflow causes a reduction in luminance.

FIG. 12 shows a graph showing the relation between emission wavelength and external quantum efficiency in the semiconductor light-emitting device.

As is apparent from FIG. 12, the overflow of electron becomes particularly significant in the semiconductor light-emitting device that has an emission wavelength equal to or shorter than about 590 nm, and therefore, the luminous efficiency falls with reduced luminance. For the above-mentioned reasons, the luminous efficiency falls in the short-wavelength semiconductor light-emitting device, and it is difficult to obtain a high-intensity semiconductor light-emitting device.

SUMMARY OF THE INVENTION

An object of the present invention is therefore to improve the luminance by increasing the probability of radiative recombination of electrons and holes in the active layer of an AlGaInP-based semiconductor light-emitting device of a short wavelength.

In order to solve the aforementioned object, the present invention provides a semiconductor light-emitting device comprising:

a compound semiconductor substrate;

a first-conductive-type clad layer formed on the compound semiconductor substrate;

an active layer formed on the first-conductive-type clad layer and comprised of an AlGaInP-based semiconductor wherein light emitted from the active layer has a wavelength of not greater than 590 nm;

a second-conductive-type clad layer formed on the active layer; and a semiconductor layer interposed between the active layer and the first-conductive-type clad layer or the second-conductive-type clad layer, wherein an energy position at a lower end of a conduction band of the semiconductor layer is 0.05 eV to 1.0 eV higher than an energy position at a lower end of a conduction band of the second-conductive-type clad layer in a band profile before formation of a junction between the active layer and the semiconductor layer, and a junction between the semiconductor layer and the first-conductive-type clad layer or the second-conductive-type clad layer.

According to the semiconductor light-emitting device of the above-mentioned construction, since the semiconductor layer is interposed between the active layer and the first-conductive-type clad layer or between the active layer and the second-conductive-type clad layer, the semiconductor layer operates as an energy barrier against electrons to restrain the overflow of electrons from the active layer. As a result, there increases the probability of radiative recombination of electrons and holes in the active layer, and the luminance of the semiconductor light-emitting device can be increased.

In the present specification, the first conductive type means the p-type or the n-type. Moreover, the second conductive type means the n-type when the first conductive type is the p-type, or the second conductive type means the p-type when the first conductive type is the n-type.

The present invention also provides a semiconductor light-emitting device comprising:

a compound semiconductor substrate;

a first-conductive-type clad layer formed on the compound semiconductor substrate;

an active layer formed on the first-conductive-type clad layer and comprised of an AlGaInP-based semiconductor wherein light emitted from the active layer has a wavelength of not greater than 590 nm;

a second-conductive-type clad layer formed on the active layer; and a semiconductor layer interposed between the active layer and the first-conductive-type clad layer or between the active layer and the second-conductive-type clad layer, wherein a highest energy position at a lower end of a conduction band of the semiconductor layer is 0.02 eV to 1.0 eV higher than an energy position at a lower end of a conduction band of the second-conductive-type clad layer.

According to the semiconductor light-emitting device of the above-mentioned construction, since the semiconductor layer is interposed between the active layer and the first-conductive-type clad layer or between the active layer and the second-conductive-type clad layer, the semiconductor layer operates as an energy barrier against electrons to restrain the overflow of electrons from the active layer. As a result, there increases the probability of radiative recombination of electrons and holes in the active layer, and the luminance of the semiconductor light-emitting device can be increased.

The present invention also provides a semiconductor light-emitting device comprising:

a compound semiconductor substrate;

a first-conductive-type clad layer formed on the compound semiconductor substrate;

an active layer formed on the first-conductive-type clad layer and comprised of an AlGaInP-based semiconductor wherein light emitted from the active layer has a wavelength of not greater than 590 nm;

a first second-conductive-type clad layer formed on the active layer;

a second second-conductive-type clad layer formed on the first second-conductive-type clad layer; and at least one semiconductor layer interposed between the first second-conductive-type clad layer and the second second-conductive-type clad layer, wherein an energy position at a lower end of a conduction band of the semiconductor layer is 0.05 eV to 1.0 eV higher than an energy position at a lower end of a conduction band of the second second-conductive-type clad layer in a band profile before formation of a junction between the first second-conductive-type clad layer and the semiconductor layer and a junction between the semiconductor layer and second second-conductive-type clad layer.

According to the semiconductor light-emitting device of the above-mentioned construction, since the semiconductor layer is interposed between the first second-conductive-type clad layer and the second second-conductive-type clad layer, the semiconductor layer operates as an energy barrier against electrons to restrain the overflow of electrons from the active layer. As a result, there increases the probability of radiative recombination of electrons and holes in the active layer, and the luminance of the semiconductor light-emitting device can be increased.

The present invention also provides a semiconductor light-emitting device comprising:

a compound semiconductor substrate;

a first-conductive-type clad layer formed on the a compound semiconductor substrate;

an active layer formed on the first-conductive-type clad layer and comprised of an AlGaInP-based semiconductor wherein light emitted from the active layer has a wavelength of not greater than 590 nm;

a first second-conductive-type clad layer formed on the active layer;

a second second-conductive-type clad layer formed on the first second-conductive-type clad layer; and at least one semiconductor layer interposed between the first second-conductive-type clad layer and the second second-conductive-type clad layer, wherein an energy position at a lower end of a conduction band of the semiconductor layer is 0.02 eV to 1.0 eV higher than an energy position at a lower end of a conduction band of the second second-conductive-type clad layer.

According to the semiconductor light-emitting device of the above-mentioned construction, since the semiconductor layer is interposed between the first second-conductive-type clad layer and the second second-conductive-type clad layer, the semiconductor layer operates as an energy barrier against electrons to restrain the overflow of electrons from the active layer. As a result, there increases the probability of radiative recombination of electrons and holes in the active layer, and the luminance of the semiconductor light-emitting device can be increased.

The present invention also provides a semiconductor light-emitting device comprising:

a compound semiconductor substrate;

a first first-conductive-type clad layer formed on the compound semiconductor substrate;

a second first-conductive-type clad layer formed on the first first-conductive-type clad layer;

at least one semiconductor layer interposed between the first first-conductive-type clad layer and the second first-conductive-type clad layer;

an active layer formed on the second first-conductive-type clad layer and comprised of an AlGaInP-based semiconductor wherein light emitted from the active layer has a wavelength of not greater than 590 nm; and a second-conductive-type clad layer formed on the semiconductor layer, wherein an energy position at a lower end of a conduction band of the semiconductor layer is 0.05 eV to 1.0 eV higher than an energy position at a lower end of a conduction band of the first first-conductive-type clad layer in a band profile before formation of a junction between the first first-conductive-type clad layer and the semiconductor layer and a junction between the semiconductor layer and second first-conductive-type clad layer.

According to the semiconductor light-emitting device of the above-mentioned construction, since the semiconductor layer is interposed between the first first-conductive-type clad layer and the second first-conductive-type clad layer, the semiconductor layer operates as an energy barrier against electrons to restrain the overflow of electrons from the active layer. As a result, there increases the probability of radiative recombination of electrons and holes in the active layer, and the luminance of the semiconductor light-emitting device can be increased.

The present invention also provides a semiconductor light-emitting device comprising:

a compound semiconductor substrate;

a first first-conductive-type clad layer formed on the compound semiconductor substrate;

a second first-conductive-type clad layer formed on the first first-conductive-type clad layer;

at least one semiconductor layer interposed between the first first-conductive-type clad layer and the second first-conductive-type clad layer;

an active layer formed on the second first-conductive-type clad layer and comprised of an AlGaInP-based semiconductor wherein light emitted from the active layer has a wavelength of not greater than 590 nm; and a second-conductive-type clad layer formed on the semiconductor layer, wherein an energy position at a lower end of a conduction band of the semiconductor layer is 0.02 eV to 1.0 eV higher than an energy position at a lower end of a conduction band of the first first-conductive-type clad layer.

According to the semiconductor light-emitting device of the above-mentioned construction, since the semiconductor layer is interposed between the first first-conductive-type clad layer and the second first-conductive-type clad layer, the semiconductor layer operates as an energy barrier against electrons to restrain the overflow of electrons from the active layer. As a result, there increases the probability of radiative recombination of electrons and holes in the active layer, and the luminance of the semiconductor light-emitting device can be increased.

In the semiconductor light-emitting device of one embodiment, the semiconductor layer is either one of a group consisting of a GaP layer, an $Al_xGa_{1-x}P$ ($0<x\leq0.7$) layer and an $(Al_xGa_{1-x})_yIn_{1-y}P$ ($0<x\leq0.7$, $0.65\leq y<1$) layer.

In the semiconductor light-emitting device of the above-mentioned embodiment, the semiconductor layer is either one of the GaP layer, the $Al_xGa_{1-x}P$ ($0<x\leq0.7$) layer and the $(Al_xGa_{1-x})_yIn_{1-y}P$ ($0<x\leq0.7$, $0.65\leq y<1$) layer. Therefore, the overflow of electrons from the active layer can reliably be restrained.

In the semiconductor light-emitting device of one embodiment, the semiconductor layer has a thickness range of 10 Å to 500 Å.

In the semiconductor light-emitting device of the above-mentioned embodiment, the thickness of the semiconductor layer is within the range of 10 Å to 500 Å. Therefore, the overflow of electrons from the active layer can reliably be restrained, and crystal defect due to lattice mismatch can be restrained. That is, when the thickness of the semiconductor layer is smaller than 10 Å, the overflow of electrons cannot reliably be restrained. When the thickness of the semiconductor layer exceeds 500 Å, the crystal defect due to lattice mismatch occurs.

In the semiconductor light-emitting device of one embodiment, the semiconductor layer has a thickness range of 10 Å to 140 Å.

Since the layer having lattice mismatch is inserted, wafer warp occurs. The wafer warp significantly occurs when a wafer is thinned by grinding before the wafer obtained after growth is divided into device elements. However, in the semiconductor light-emitting device of the above-mentioned embodiment, the layer thickness is set smaller than 500 Å or, in particular, not greater than 140 Å. Therefore, the wafer warp can reliably be restrained. Accordingly, it is preferable to set the thickness of the semiconductor layer within the range of 10 Å to 140 Å.

In the semiconductor light-emitting device of one embodiment, the active layer is an SQW active layer or an MQW active layer.

In the semiconductor light-emitting device of one embodiment, the SQW layer or the MQW layer is comprised of a plurality of barrier layers and at least one well layer, and the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ ($x=0.7$, $y=0.51$).

According to the semiconductor light-emitting device of the above-mentioned embodiment, the energy position at the lower end of the conduction band from the vacuum level in part or all of the barrier layers is 0.05 eV to 1.0 eV higher than the energy position at the lower end of the conduction band from the vacuum level in $(Al_xGa_{1-x})_yIn_{1-y}P$ ($x=0.7$, $y=0.51$). Therefore, electrons can reliably be confined in the well layer. As a result, there increases the probability of radiative recombination of electrons and holes in the active layer, and the luminance of the semiconductor light-emitting device can be increased.

The present invention also provides a semiconductor light-emitting device comprising:

a compound semiconductor substrate;

a first-conductive-type clad layer formed on the compound semiconductor substrate;

an active layer formed on the first-conductive-type clad layer; and a second-conductive-type clad layer formed on the active layerm, wherein the active layer is an SQW active layer or an MQW active layer comprised of an AlGaInP-based semiconductor, the SQW layer or the MQW layer is comprised of a plurality of barrier layers and at least one well layer, and an energy position at a lower end of a conduction band from a vacuum level in part or all of the barrier layers is 0.05 eV to 1.0 eV higher than an energy position at a lower end of a conduction band from a vacuum level in $(Al_xGa_{1-x})_yIn_{1-y}P$ ($x=0.7$, $y=0.51$).

According to the semiconductor light-emitting device of the above-mentioned construction, the energy position at the lower end of the conduction band from the vacuum level in part or all of the barrier layers is 0.05 eV to 1.0 eV higher than the energy position at the lower end of the conduction band from the vacuum level in $(Al_xGa_{1-x})_yIn_{1-y}P$ (x=0.7, y=0.51). Therefore, the overflow of electrons from the active layer can be restrained by reliably confining the electrons in the well layer. As a result, there increases the probability of radiative recombination of electrons and holes in the active layer, and the luminance of the semiconductor light-emitting device can be increased.

In the semiconductor light-emitting device of one embodiment, the barrier layers are either one of a group consisting of a GaP layer, an $Al_xGa_{1-x}P$ ($0<x\leq0.7$) layer and an $(Al_xGa_{1-x})_yIn_{1-y}P$ ($0<x\leq0.7$, $0.65\leq y<1$) layer.

According to the semiconductor light-emitting device of the above-mentioned embodiment, the barrier layers should preferably be either one of the GaP layer, the $Al_xGa_{1-x}P$ ($0<x\leq0.7$) layer and the $(Al_xGa_{1-x})_yIn_{1-y}P$ ($0<x\leq0.7$, $0.65\leq y<1$) layer in terms of reliably restraining the overflow of electrons from the active layer.

In the semiconductor light-emitting device of one embodiment, the semiconductor layer or each of the barrier layers is the second conductive type.

In the semiconductor light-emitting device of one embodiment, the semiconductor layer or each of the barrier layers has a carrier density of $1\times10^{17}$ to $5\times10^{18}$ cm$^{-3}$.

In the semiconductor light-emitting device of one embodiment, the first conductive type is n-type, and the second conductive type is p-type.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The Present invention will be described in detailed below based on embodiments thereof.

First Embodiment

A light-emitting diode which is a semiconductor light-emitting device according to a first embodiment of the present invention will be described with reference to FIGS. 1A and 1B.

Figure 1A:
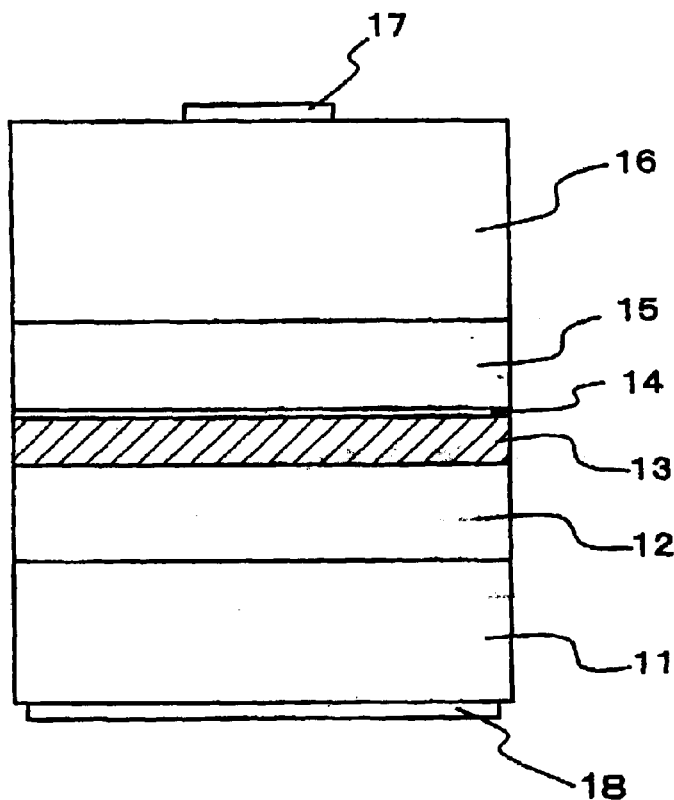
FIG. 1A is a schematic sectional view showing the construction of a semiconductor light-emitting device according to a first embodiment of the present invention.

As shown in FIG. 1A, the light-emitting diode is provided with an n-type $(Al_xGa_{1-x})_{0.51}In_{0.49}P$ ($0.7\leq x\leq1$) lower clad layer 12 serving as one example of the first-conductive-type clad layer, an $(Al_xGa_{1-x})_{0.51}In_{0.49}P$ ($0\leq x\leq1$) active layer 13 serving as one example of the active layer and a p-type $(Al_xGa_{1-x})_{0.51}In_{0.49}P$ ($0.7\leq x\leq1$) upper clad layer 15 serving as one example of the second-conductive-type clad layer, which are successively formed on an n-type GaAs substrate 11 serving as one example of the compound semiconductor substrate. Then, a p-type GaP layer 14 serving as one example of the semiconductor layer is interposed between the active layer 13 and the upper clad layer 15.

The active layer 13 emits light that has a wavelength of not greater than 590 nm. The highest energy position at the lower end of the conduction band of this p-type GaP layer 14 is 0.02 eV to 1.0 eV higher than the energy position at the lower end of the conduction band of the upper clad layer 15. Moreover, in the band profile before the formation of the junctions of the active layer 13, the p-type GaP layer 14 and the upper clad layer 15, the energy position at the lower end of the conduction band of the p-type GaP layer 14 is 0.05 eV to 1.0 eV higher than the energy position at the lower end of the conduction band of the upper clad layer 15.

Moreover, a current diffusion layer 16 is formed on the upper clad layer 15, and a p-type electrode 17 is formed on this current diffusion layer 16. An n-type electrode 18 is formed under the n-type GaAs substrate 11.

Figure 1B:
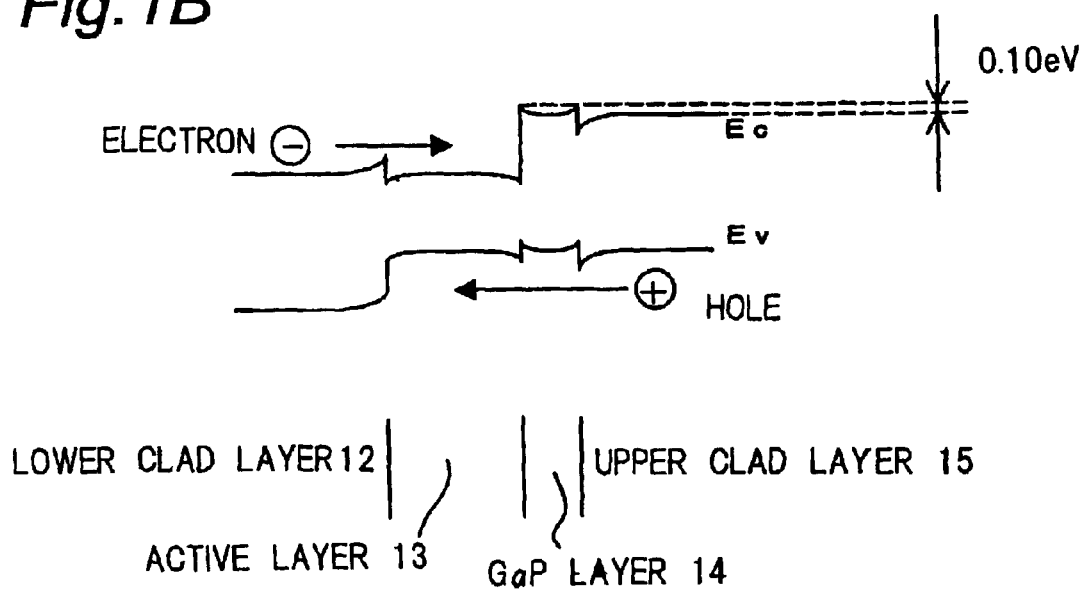
FIG. 1B is a view showing one example of a band profile in the vicinity of an active layer of the semiconductor light-emitting device.

FIG. 1B shows one example of a band profile in the vicinity of the active layer 13 in the light-emitting diode of the first embodiment.

The light-emitting diode of the first embodiment has the p-type GaP layer 14 between the active layer 13 and the upper clad layer 15. Before the active layer 13, the p-type GaP layer 14 and the upper clad layer 15 are joined, the energy difference at the lower end of the conduction band between the active layer 13 and the p-type GaP layer 14 is larger than the energy difference at the lower end of the conduction band between the active layer 13 and the upper clad layer 15. Therefore, after the active layer 13, the p-type GaP layer 14 and the upper clad layer 15 are joined, there generates a notch due to energy discontinuity of about 0.3 eV difference between the active layer 13 and the p-type GaP layer 14, where an energy barrier is formed which is about 0.1 eV higher than the lower end Ec of the conduction band of the upper clad layer 15 as shown in FIG. 1B. This energy barrier operates as an energy barrier against the electrons supplied from the lower clad layer 12.

Figure 10:
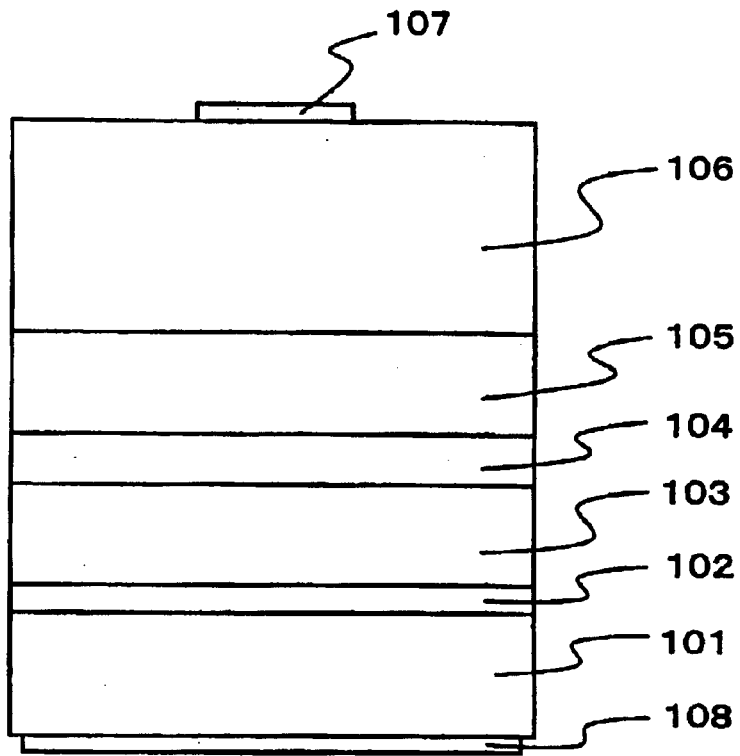
FIG. 10 is a schematic sectional view showing the construction of a prior art semiconductor light-emitting device.
Figure 11:
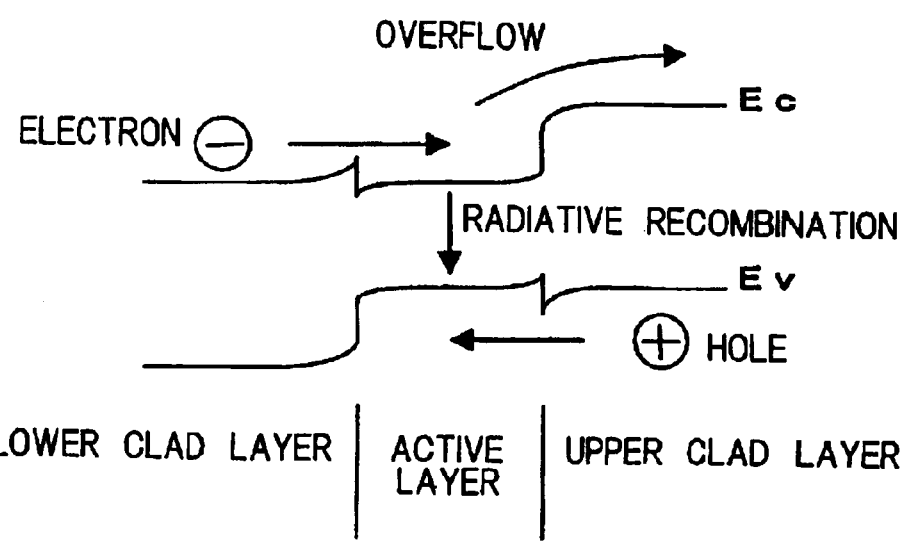
FIG. 11 is a view showing one example of a band profile in the vicinity of an active layer of the prior art semiconductor light-emitting device.
Figure 12:
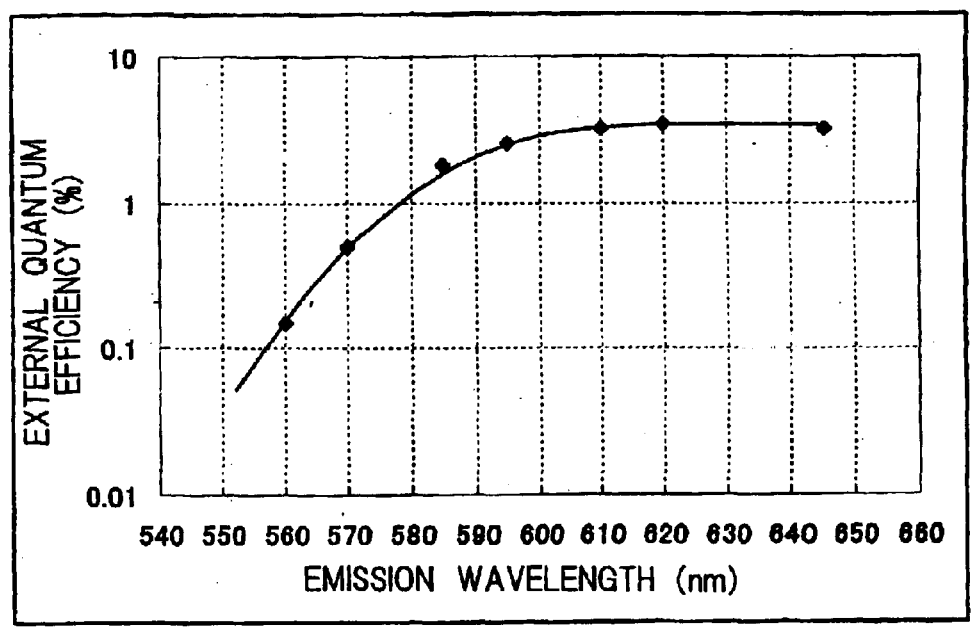
FIG. 12 is a graph showing relation between an emission wavelength and an external quantum efficiency of the prior art semiconductor light-emitting device.

As described above, formation of the notch energy barrier furthermore restrains the overflow of the electrons supplied from the lower clad layer 12 than when the GaP layer 14 does not exist. As a result, there increases the probability of radiative recombination between electrons and holes in the active layer 13, and therefore, the luminance is more increased than that in the prior art shown in FIG. 10.

The fabricating method of the light-emitting diode of the first embodiment will be described below.

First of all, as shown in FIG. 1A, an n-type $(Al_xGa_{1-x})_{0.51}In_{0.49}P$ ($0.7 \leq x \leq 1$) lower clad layer 12 (e.g., x==1.0, Si carrier density: $5 \times 10^{17}$ cm$^{-3}$, thickness: 1.0 µm) and an $(Al_xGa_{1-x})_{0.51}In_{0.49}P$ ($0 \leq x \leq 1$) active layer 13 (e.g., x=0.30, thickness: 0.3 µm) are successively grown on the n-type GaAs substrate 11.

Subsequently, the p-type GaP layer 14 (thickness: 20 Å, carrier density: $1 \times 10^{17}$ cm$^{-3}$) and the p-type $(Al_xGa_{1-x})_{0.51}In_{0.49}P$ ($0.7 \leq x \leq 1$) upper clad layer 15 (e.g., x=1.0, Zn carrier density: $7 \times 10^{17}$ cm$^{-3}$, thickness: 1.0 µm) are successively grown on the active layer 13. Further, the current diffusion layer 16 is grown on the upper clad layer 15. In this case, the p-type GaP layer 14 has a lattice mismatch of about 3.5% with respect to GaAs. However, since the GaP thickness has a small value of about 20 Å, no lattice relaxation occurs. As a result, no such crystal defect as cross hatching occurs.

Then, by using vapor deposition, the p-type electrode 17 (e.g., Au—Zn) is formed on the current diffusion layer 16, and the n-type electrode 18 (e.g., Au—Ge) is formed under the n-type GaAs substrate. The p-type electrode 17 is formed into a circular shape for example, so that a light-emitting diode is completed.

In the first embodiment, the active layer 13 is formed between the lower clad layer 12 and the p-type GaP layer 14.

However, it is acceptable to form an SQW active layer or an MQW active layer instead of the active layer 13 between the lower clad layer 12 and the p-type GaP layer 14.

It is also acceptable to successively form a p-type lower clad layer, an active layer and an n-type upper clad layer on a substrate and provide a p-type GaP layer between the p-type lower clad layer and the active layer.

Second Embodiment

A light-emitting diode which is a semiconductor light-emitting device according to a second embodiment of the present invention will be described with reference to FIGS. 2A and 2B.

Figure 2A:
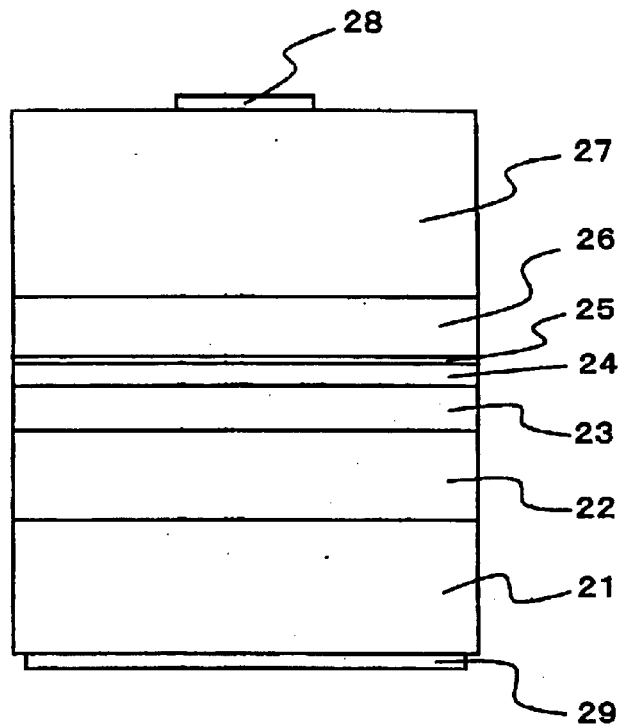
FIG. 2A is a schematic sectional view showing the construction of a semiconductor light-emitting device according to a second embodiment of the present invention.

As shown in FIG. 2A, the light-emitting diode is provided with an n-type $(Al_xGa_{1-x})_{0.51}In_{0.49}P$ ($0.7 \leq x \leq 1$) lower clad layer 22 serving as one example of the first-conductive-type clad layer, an $(Al_xGa_{1-x})_{0.51}In_{0.49}P$ ($0 \leq x \leq 1$) active layer 23 serving as one example of the active layer, a p-type $(Al_xGa_{1-x})_{0.51}In_{0.49}P$ ($0.7 \leq x \leq 1$) first upper clad layer 24 serving as one example of the first second-conductive-type clad layer and a p-type $(Al_xGa_{1-x})_{0.51}In_{0.49}P$ ($0.7 \leq x \leq 1$) second upper clad layer 26 serving as one example of the second second-conductive-type clad layer, which are successively formed on an n-type GaAs substrate 21 serving as one example of the compound semiconductor substrate. Then, a p-type GaP layer 25 serving as one example of the semiconductor layer is interposed between the first upper clad layer 24 and the second upper clad layer 26.

The active layer 23 emits light that has a wavelength of not greater than 590 nm. The highest energy position at the lower end of the conduction band of this p-type GaP layer 25 is 0.02 eV to 1.0 eV higher than the energy position at the lower end of the conduction band of the second upper clad layer 26. Moreover, in the band profile before the formation of the junctions of the first upper clad layer 24, the p-type GaP layer 25 and the second upper clad layer 26, the energy position at the lower end of the conduction band of the p-type GaP layer 25 is 0.05 eV to 1.0 eV higher than the energy position at the lower end of the conduction band of the second upper clad layer 26.

Moreover, a current diffusion layer 27 is formed on the second upper clad layer 26, and a p-type electrode 28 is formed on this current diffusion layer 27. An n-type electrode 29 is formed under the n-type GaAs substrate 21.

Figure 2B:
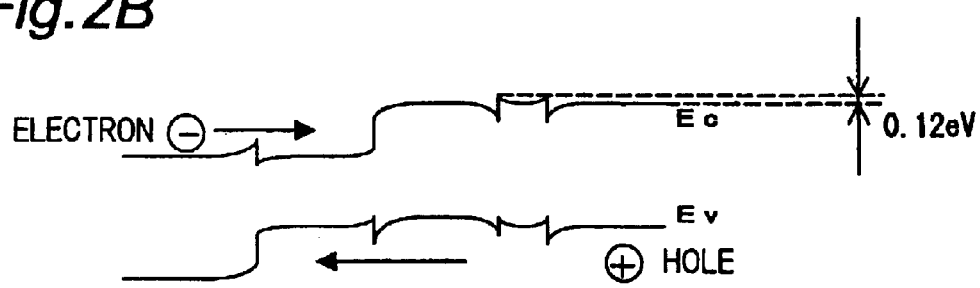
FIG. 2B is a view showing one example of a band profile in the vicinity of an active layer of the semiconductor light-emitting device.
Figure 2B:
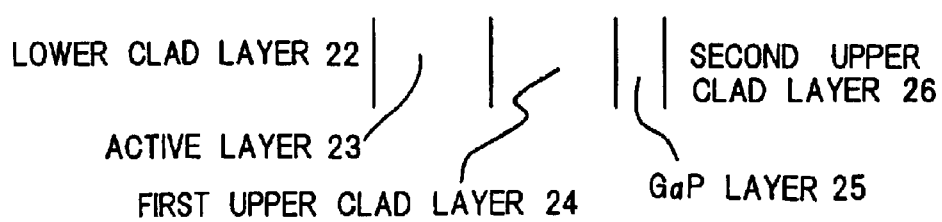

FIG. 2B shows one example of the band profile in the vicinity of the active layer 23 of the light-emitting diode of the second embodiment.

The light-emitting diode of the second embodiment has the p-type GaP layer 25 between the first upper clad layer 24 and the second upper clad layer 26. There is energy discontinuity between the first upper clad layer 24 and the p-type GaP layer 25. Therefore, after the first upper clad layer 24 and the p-type GaP layer 25 are joined, there generates a notch due to energy discontinuity of about 0.25 eV difference between the first upper clad layer 24 and the p-type GaP layer 25, where an energy barrier is formed which is about 0.12 eV higher than the lower end Ec of the conduction band of the first upper clad layer 24 as shown in FIG. 2B. This energy barrier operates as an energy barrier against the electrons supplied from the lower clad layer 22.

As described above, due to the energy barrier ascribed to the notch, overflow of the electrons supplied from the lower clad layer 22 can be restrained further than when the p-type GaP layer 25 does not exist. As a result, there increases the probability of radiative recombination of electrons and holes in the active layer 23, and therefore, the luminance increases further than in the prior art shown in FIG. 10.

The fabricating method of the light-emitting diode of the second embodiment will be described below.

First of all, as shown in FIG. 2A, an n-type $(Al_xGa_{1-x})_{0.51}In_{0.49}P$ ($0.7 \leq x \leq 1$) lower clad layer 22 (e.g., x=0.7, Si carrier density: $5 \times 10^{17}$ cm$^{-3}$, thickness: 1.0 μm) and an $(Al_xGa_{1-x})_{0.51}In_{0.49}P$ ($0 \leq x \leq 1$) active layer 23 (e.g., x=0.40, thickness: 0.4 μm) are successively grown on the n-type GaAs substrate 21.

Subsequently, the p-type $(Al_xGa_{1-x})_{0.51}In_{0.49}P$ ($0.7 \leq x \leq 1$) first upper clad layer 24 (e.g., x=0.7, Zn carrier density: $5 \times 10^{17}$ cm$^{-3}$, thickness: 0.2 μm), the p-type GaP layer 25 (thickness: 40 Å, carrier density: $1 \times 10^{18}$ cm$^{-3}$) and the p-type $(Al_xGa_{1-x})_{0.51}In_{0.49}P$ ($0.7 \leq x \leq 1$) second upper clad layer 26 (e.g., x=0.7, Zn carrier density: $5 \times 10^{17}$ cm$^{-3}$, thickness: 0.7 μm) are successively grown on the active layer 23. Further, the current diffusion layer 27 is grown on the second upper clad layer 26.

Then, the p-type electrode 28 (e.g., Au—Zn) is formed on the current diffusion layer 27, and the n-type electrode 29 (e.g., Au—Ge) is formed under the n-type GaAs substrate 21, each by vapor deposition. The p-type electrode 28 is formed into a circular shape for example, so that a light-emitting diode is completed.

In the second embodiment, one p-type GaP layer 25 is interposed between the first upper clad layer 24 and the second upper clad layer 26. However, it is acceptable to interpose a plurality of p-type GaP layers between the first upper clad layer 24 and the second upper clad layer 26.

It is also acceptable to successively form a first p-type lower clad layer, a second p-type lower clad layer, an active layer and an upper clad layer on a substrate and provide a p-type GaP layer between the first p-type lower clad layer and the second p-type lower clad layer. It is needless to say that a plurality of p-type GaP layers may be provided between the first p-type lower clad layer and the second p-type lower clad layer.

Third Embodiment

A light-emitting diode which is a semiconductor light-emitting device according to a third embodiment of the present invention will be described with reference to FIGS. 3A and 3B.

Figure 3A:
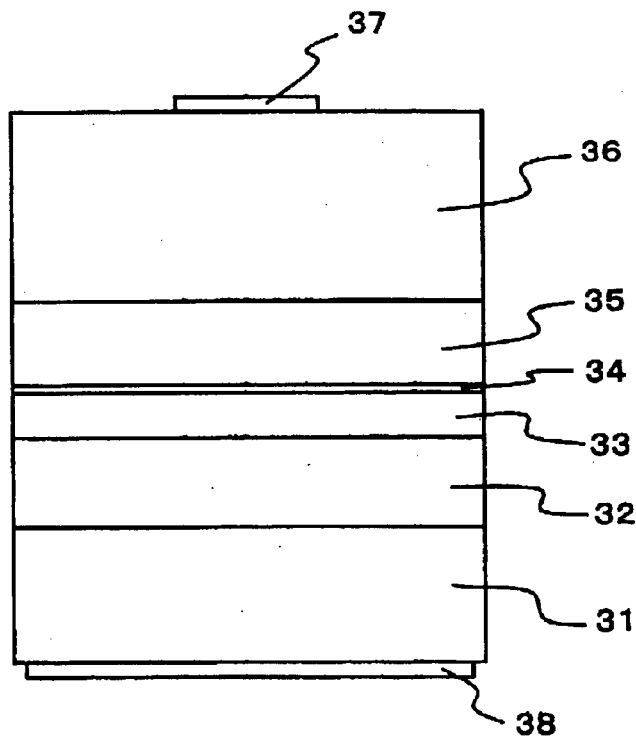
FIG. 3A is a schematic sectional view showing the construction of a semiconductor light-emitting device according to a third embodiment of the present invention.

As shown in FIG. 3A, the light-emitting diode is provided with an n-type $(Al_xGa_{1-x})_{0.51}In_{0.49}P$ ($0.7 \leq x \leq 1$) lower clad layer 32 serving as one example of the first-conductive-type clad layer, an $(Al_xGa_{1-x})_{0.51}In_{0.49}P$ ($0 \leq x \leq 1$) active layer 33 serving as one example of the active layer and a p-type $(Al_xGa_{1-x})_{0.51}In_{0.49}P$ ($0.7 \leq x \leq 1$) upper clad layer 35 serving as one example of the second-conductive-type clad layer, which are successively formed on an n-type GaAs substrate 31 serving as one example of the compound semiconductor substrate. Then, a p-type $Al_xGa_{1-x}P$ ($0 < x \leq 0.7$) layer 34 serving as one example of the semiconductor layer is interposed between the active layer 33 and the upper clad layer 35.

The active layer 33 emits light that has a wavelength of not greater than 590 nm. The highest energy position at the lower end of the conduction band of this p-type $Al_xGa_{1-x}P$ ($0 < x \leq 0.7$) layer 34 is 0.02 eV to 1.0 eV higher than the energy position at the lower end of the conduction band of the upper clad layer 35. Moreover, in the band profile before the formation of the junction between the active layer 33 and the p-type $Al_xGa_{1-x}P$ ($0 < x \leq 0.7$) layer 34 and the formation of the junction between the p-type $Al_xGa_{1-x}P$ ($0 < x \leq 0.7$) layer 34 and the upper clad layer 35, the energy position at the lower end of the conduction band of the p-type $Al_xGa_{1-x}P$ ($0 < x \leq 0.7$) layer 34 is 0.05 eV to 1.0 eV higher than the energy position at the lower end of the conduction band of the upper clad layer 35.

Moreover, a current diffusion layer 36 is formed on the upper clad layer 35, and a p-type electrode 37 is formed on this current diffusion layer 36. An n-type electrode 38 is formed under the n-type GaAs substrate 31.

Figure 3B:
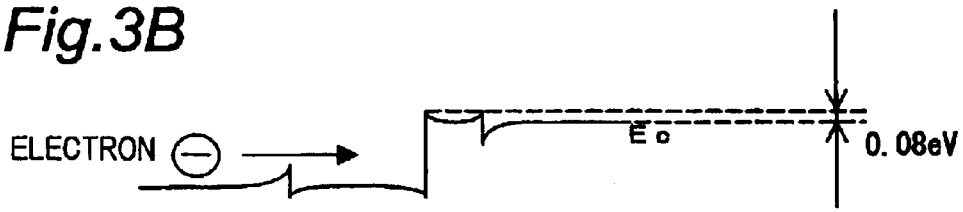
FIG. 3B is a view showing one example of a band profile in the vicinity of an active layer of the semiconductor light-emitting device.
Figure 3B:
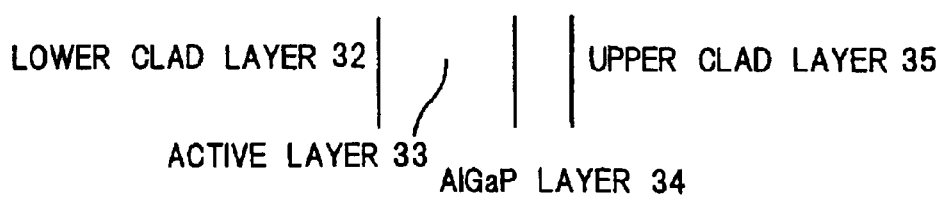

FIG. 3B shows one example of the band profile in the vicinity of the active layer 33 of the light-emitting diode of the third embodiment.

The light-emitting diode of the third embodiment has the p-type $Al_xGa_{1-x}P$ ($0 < x \leq 0.7$) layer 34 between the active layer 33 and the upper clad layer 35. Before the active layer 33, the p-type $Al_xGa_{1-x}P$ ($0 < x \leq 0.7$) layer 34 and the upper clad layer 35 are joined, the energy difference at the lower end of the conduction band between the active layer 33 and the p-type $Al_xGa_{1-x}P$ ($0 < x \leq 0.7$) layer 34 is larger than the energy difference between the active layer 33 and the upper clad layer 35. Therefore, after the active layer 33, the p-type $Al_xGa_{1-x}P$ ($0 < x \leq 0.7$) layer 34 and the upper clad layer 35 are joined, there generates a notch due to energy discontinuity of about 0.20 eV difference between the active layer 33 and the p-type $Al_xGa_{1-x}P$ ($0 < x \leq 0.7$) layer 34, where an energy barrier is formed which is about 0.08 eV higher than the lower end Ec of the conduction band of the upper clad layer 35, as shown in FIG. 3B. This energy barrier operates as an energy barrier against the electrons supplied from the lower clad layer 32.

As described above, due to the energy barrier ascribed to the notch, the overflow of the electrons supplied from the lower clad layer 32 can be restrained further than when the p-type $Al_xGa_{1-x}P$ ($0 < x \leq 0.7$) layer 34 does not exist. As a result, there increases the probability of radiative recombination of electrons and holes in the active layer 33, and therefore, the luminance increases further than in the prior art shown in FIG. 10.

The fabricating method of the light-emitting diode of the third embodiment will be described below.

First of all, as shown in FIG. 3A, the n-type $(Al_xGa_{1-x})_{0.51}In_{0.49}P$ ($0.7 \leq x \leq 1$) lower clad layer 32 (e.g., x=0.9, Si carrier density: $5 \times 10^{17}$ cm$^{-3}$, thickness: 0.7 μm) and the $(Al_xGa_{1-x})_{0.51}In_{0.49}P$ ($0 \leq x \leq 1$) active layer 33 (e.g., x=0.35, thickness: 0.5 μm) are successively grown on the n-type GaAs substrate 31.

Subsequently, the p-type $Al_xGa_{1-x}P$ ($0 < x \leq 0.7$) layer 34 (e.g., x=0.20, thickness: 50 Å, carrier density: $2 \times 10^{18}$ cm$^{-3}$) and the p-type $(Al_xGa_{1-x})_{0.51}In_{0.49}P$ ($0.7 \leq x \leq 1$) upper clad layer 35 (e.g., x=0.8, Zn carrier density: $5 \times 10^{17}$ cm$^{-3}$, thickness: 0.7 μm) are successively grown on the active layer 33. Further, the current diffusion layer 36 is grown on the upper clad layer 35.

Then, the p-type electrode 37 (e.g., Au—Zn) is formed on the current diffusion layer 36, and the n-type electrode 38 (e.g., Au—Ge) is formed under the n-type GaAs substrate 31, each by vapor deposition. The p-type electrode 37 is formed into a circular shape for example, so that a light-emitting diode is completed.

It is also acceptable to successively form a p-type lower clad layer, an active layer and an n-type upper clad layer on a substrate and provide a p-type $Al_xGa_{1-x}P$ ($0 < x \leq 0.7$) layer between the p-type lower clad layer and the active layer.

Fourth Embodiment

A light-emitting diode which is a semiconductor light-emitting device according to a fourth embodiment of the present invention will be described with reference to FIGS. 4A and 4B.

Figure 4A:
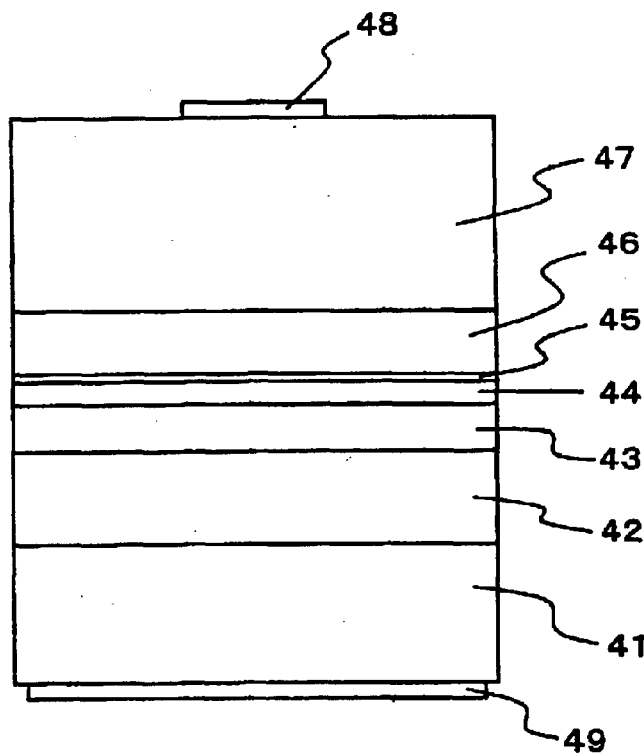
FIG. 4A is a schematic sectional view showing the construction of a semiconductor light-emitting device according to a fourth embodiment of the present invention.

As shown in FIG. 4A, the light-emitting diode is provided with an n-type $(Al_xGa_{1-x})_{0.51}In_{0.49}P$ ($0.7 \leq x \leq 1$) lower clad layer 42 serving as one example of the first-conductive-type clad layer, an $(Al_xGa_{1-x})_{0.51}In_{0.49}P$ ($0 \leq x \leq 1$) active layer 43 serving as one example of the active layer and a p-type $(Al_xGa_{1-x})_{0.51}In_{0.49}P$ ($0.7 \leq x \leq 1$) first upper clad layer 44 serving as one example of the first second-conductive-type clad layer and a p-type $(Al_xGa_{1-x})_{0.51}In_{0.49}P$ ($0.7 \leq x \leq 1$) second upper clad layer 46 serving as one example of the second second-conductive-type clad layer, which are successively formed on an n-type GaAs substrate 41 serving as one example of the compound semiconductor substrate. Then, a p-type $Al_xGa_{1-x}P$ ($0<x\leq0.7$) layer 45 serving as one example of the semiconductor layer is interposed between the first upper clad layer 44 and the second upper clad layer 46.

The active layer 43 emits light that has a wavelength of not greater than 590 nm. The highest energy position at the lower end of the conduction band of this p-type $Al_xGa_{1-x}P$ ($0<x\leq0.7$) layer 45 is 0.02 eV to 1.0 eV higher than the energy position at the lower end of the conduction band of the second upper clad layer 46. Moreover, in the band profile before the formation of the junctions of the first upper clad layer 44, the p-type $Al_xGa_{1-x}P$ ($0<x\leq0.7$) layer 45 and the second upper clad layer, the energy position at the lower end of the conduction band of the p-type $Al_xGa_{1-x}P$ ($0<x\leq0.7$) layer 45 is 0.05 eV to 1.0 eV higher than the energy position at the lower end of the conduction band of the second upper clad layer 46.

Moreover, a current diffusion layer 47 is formed on the second upper clad layer 46, and a p-type electrode 48 is formed on this current diffusion layer 47. An n-type electrode 49 is formed under the n-type GaAs substrate 41.

Figure 4B:
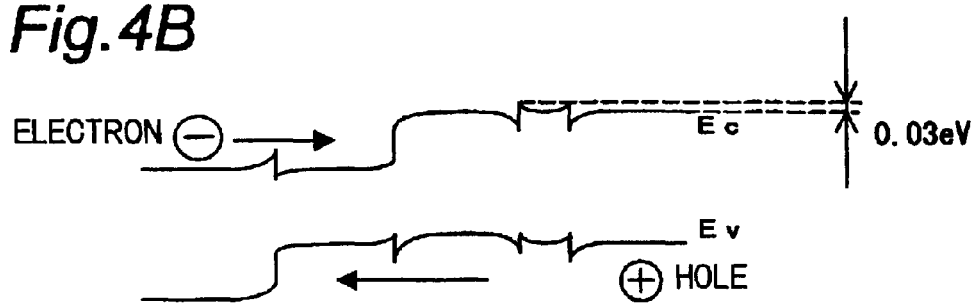
FIG. 4B is a view showing one example of a band profile in the vicinity of an active layer of the semiconductor light-emitting device.
Figure 4B:
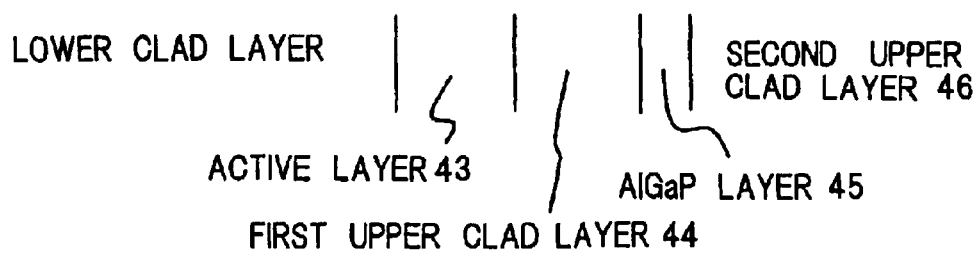

FIG. 4B shows one example of the band profile in the vicinity of the active layer 43 of the light-emitting diode of the fourth embodiment.

The light-emitting diode of the fourth embodiment has the p-type $Al_xGa_{1-x}P$ ($0<x\leq0.7$) layer 45 between the first upper clad layer 44 and the second upper clad layer 46. There is energy discontinuity between the first upper clad layer 44 and the p-type $Al_xGa_{1-x}P$ ($0<x\leq0.7$) layer 45. Therefore, after the first upper clad layer 44 and the p-type $Al_xGa_{1-x}P$ ($0<x\leq0.7$) layer 45 are joined, there generates a notch due to energy discontinuity of about 0.07 eV difference between the first upper clad layer 44 and the p-type $Al_xGa_{1-x}P$ ($0<x\leq0.7$) layer 45, where an energy barrier is formed which is about 0.03 eV higher than the lower end Ec of the conduction band of the upper clad layer 44, as shown in FIG. 4B.

This energy barrier operates as an energy barrier against the electrons supplied from the lower clad layer 42.

As described above, due to the energy barrier ascribed to the notch, the overflow of the electrons supplied from the lower clad layer 42 can be restrained further than when the p-type $Al_xGa_{1-x}P$ ($0<x\leq0.7$) layer 45 does not exist. As a result, there increases the probability of radiative recombination of electrons and holes in the active layer 43, and therefore, the luminance increases further than in the prior art shown in FIG. 10.

The fabricating method of the light-emitting diode of the fourth embodiment will be described below.

First of all, as shown in FIG. 4A, the n-type $(Al_xGa_{1-x})_{0.51}In_{0.49}P$ ($0.7\leq x\leq1$) lower clad layer 42 (e.g., x=1.0, Si carrier density: $5\times10^{17}$ cm$^{-3}$, thickness: 1.0 μm) and the $(Al_xGa_{1-x})_{0.51}In_{0.49}P$ ($0\leq x\leq1$) active layer 43 (e.g., x=0.45, thickness: 0.3 μm) are successively grown on the n-type GaAs substrate 41.

Subsequently, the p-type $(Al_xGa_{1-x})_{0.51}In_{0.49}P$ ($0.7\leq x\leq1$) first upper clad layer 44 (e.g., x=0.9, Zn carrier density: $5\times10^{17}$ cm$^{-3}$, thickness: 0.1 μm), the p-type $Al_xGa_{1-x}P$ ($0<x\leq0.7$) layer 45 (e.g., x=0.60, thickness: 80 Å, carrier density: $4\times10^{17}$ cm$^{-3}$) and the p-type $(Al_xGa_{1-x})_{0.51}In_{0.49}P$ ($0.7\leq x\leq1$) second upper clad layer 46 (e.g., x=0.9, Zn carrier density: $5\times10^{17}$ cm$^{-3}$, thickness: 1.5 μm) are successively grown on the active layer 43. Further, the current diffusion layer 47 is grown on the second upper clad layer 46.

Then, the p-type electrode 48 (e.g., Au—Zn) is formed on the current diffusion layer 47, and the n-type electrode 49 (e.g., Au—Ge) is formed under the n-type GaAs substrate 41, each by vapor deposition. The p-type electrode 48 is formed into a circular shape for example, so that a light-emitting diode is completed.

In the fourth embodiment, one p-type $Al_xGa_{1-x}P$ ($0<x\leq0.7$) layer 45 is interposed between the first upper clad layer 44 and the second upper clad layer 46. However, it is acceptable to interpose a plurality of p-type $Al_xGa_{1-x}P$ ($0<x\leq0.7$) layers between the first upper clad layer 44 and the second upper clad layer 46.

Although the active layer 43 is formed between the lower clad layer 42 and the first upper clad layer 44, it is acceptable to form an SQW active layer or an MQW active layer between the lower clad layer 42 and the first upper clad layer 44 in place of the active layer 43.

It is also acceptable to successively form a first p-type lower clad layer, a second p-type lower clad layer, an active layer and an upper clad layer on a substrate and provide a p-type $Al_xGa_{1-x}P$ ($0<x\leq0.7$) layer between the first p-type lower clad layer and the second p-type lower clad layer. It is needless to say that a plurality of p-type $Al_xGa_{1-x}P$ ($0<x\leq0.7$) layers may be provided between the first p-type lower clad layer and the second p-type lower clad layer.

Fifth Embodiment

A light-emitting diode which is a semiconductor light-emitting device according to a fifth embodiment of the present invention will be described with reference to FIGS. 5A and 5B.

Figure 5A:
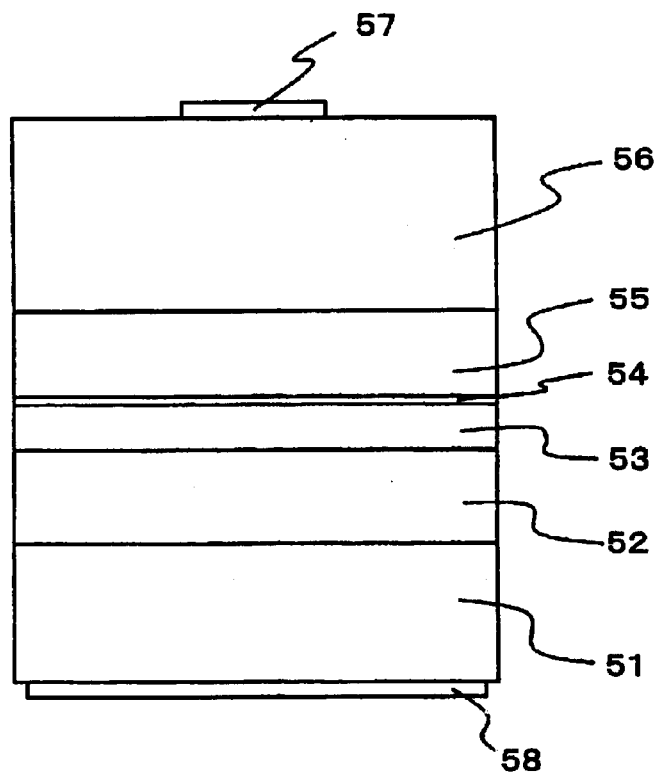
FIG. 5A is a schematic sectional view showing the construction of a semiconductor light-emitting device according to a fifth embodiment of the present invention.

As shown in FIG. 5A, the light-emitting diode is provided with an n-type $(Al_xGa_{1-x}P)_{0.51}In_{0.49}P$ ($0.7\leq x\leq1$) lower clad layer 52 serving as one example of the first-conductive-type clad layer, an $(Al_xGa_{1-x})_{0.51}In_{0.49}P$ ($0\leq x\leq1$) active layer 53 serving as one example of the active layer and a p-type $(Al_xGa_{1-x})_{0.51}In_{0.49}P$ ($0.7\leq x\leq1$) upper clad layer 55 serving as one example of the second-conductive-type clad layer, which are successively formed on an n-type GaAs substrate 51 serving as one example of the compound semiconductor substrate. Then, a p-type $(Al_xGa_{1-x})_yIn_{1-y}P$ ($0<x\leq0.7$, $0.65\leq y<1$) layer 54 serving as one example of the semiconductor layer is interposed between the active layer 53 and the upper clad layer 55.

The active layer 53 emits light that has a wavelength of not greater than 590 nm. The highest energy position at the lower end of the conduction band of this p-type $(Al_xGa_{1-x})_yIn_{1-y}P$ ($0<x\leq0.7$, $0.65\leq y<1$) layer 54 is 0.02 eV to 1.0 eV higher than the energy position at the lower end of the conduction band of the upper clad layer 55. Moreover, in the band profile before the formation of the junctions of the active layer 53, the p-type $(Al_xGa_{1-x})_yIn_{1-y}P$ ($0<x\leq0.7$, $0.65\leq y<1$) layer 54 and the upper clad layer 55, the energy position at the lower end of the conduction band of the p-type $(Al_xGa_{1-x})_yIn_{1-y}P$ ($0<x\leq0.7$, $0.65\leq y<1$) layer 54 is 0.05 eV to 1.0 eV higher than the energy position at the lower end of the conduction band of the upper clad layer 55.

A current diffusion layer 56 is formed on the upper clad layer 55, and a p-type electrode 57 is formed on this current diffusion layer 56. An n-type electrode 58 is formed under the n-type GaAs substrate 51.

Figure 5B:
FIG. 5B is a view showing one example of a band profile in the vicinity of an active layer of the semiconductor light-emitting device.
Figure 5B:
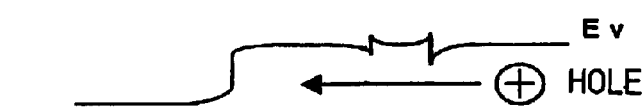
Figure 5B:
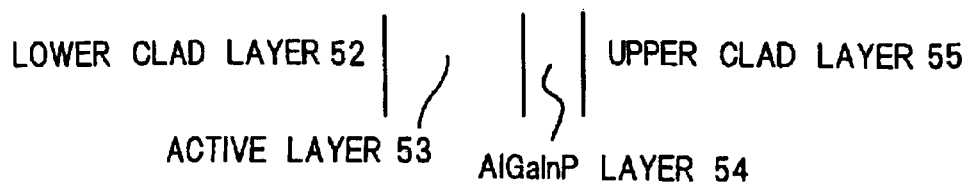

FIG. 5B shows one example of the band profile in the vicinity of the active layer 53 of the light-emitting diode of the fifth embodiment.

The light-emitting diode of the fifth embodiment has the p-type $(Al_xGa_{1-x})_yIn_{1-y}P$ ($0<x\leq0.7$, $0.65\leq y<1$) layer 54 between the active layer 53 and the upper clad layer 55. Before the active layer 53, the p-type $(Al_xGa_{1-x})_yIn_{1-y}P$ ($0<x\leq0.7$, $0.65\leq y<1$) layer 54 and the upper clad layer 55 are joined, the energy difference at the lower end of the conduction band between the active layer 53 and the p-type $(Al_xGa_{1-x})_yIn_{1-y}P$ ($0<x\leq0.7$, $0.65\leq y<1$) layer 54 is larger than the energy difference between the active layer 53 and the upper clad layer 55. Therefore, after the active layer 53, the p-type $(Al_xGa_{1-x})_yIn_{1-y}P$ ($0<x\leq0.7$, $0.65\leq y<1$) layer 54 and the upper clad layer 55 are joined, there generates a notch due to energy discontinuity of about 0.20 eV difference between the active layer 53 and the p-type $(Al_xGa_{1-x})_yIn_{1-y}P$ ($0<x\leq0.7$, $0.65\leq y<1$) layer 54, where an energy barrier is formed which is about 0.08 eV higher than the lower end Ec of the conduction band of the upper clad layer 55, as shown in FIG. 5B. This energy barrier operates as an energy barrier against the electrons supplied from the lower clad layer 52.

As described above, due to the energy barrier ascribed to the notch, the overflow of the electrons supplied from the lower clad layer 52 can be restrained further than when the p-type $(Al_xGa_{1-x})_yIn_{1-y}P$ ($0<x\leq0.7$, $0.65\leq y<1$) layer 54 does not exist. As a result, there increases the probability of radiative recombination of electrons and holes in the active layer 53, and therefore, the luminance increases further than in the prior art shown in FIG. 10.

The fabricating method of the light-emitting diode of the fifth embodiment of the present invention will be described below.

First of all, as shown in FIG. 5A, the n-type $(Al_xGa_{1-x})_{0.51}In_{0.49}P$ ($0.7\leq x\leq1$) lower clad layer 52 (e.g., x=0.9, Si carrier density: $5\times10^{17}$ cm$^{-3}$, thickness: 0.7 $\mu$m) and the $(Al_xGa_{1-x})_{0.51}In_{0.49}P$ ($0\leq x\leq1$) active layer 53 (e.g., x=0.35, thickness: 0.5 $\mu$m) are successively grown on the n-type GaAs substrate 51.

Subsequently, the p-type $(Al_xGa_{1-x})_yIn_{1-y}P$ ($0<x\leq0.7$, $0.65\leq y<1$) layer 54 (e.g., x=0.20, y=0.05, thickness: 50 Å, carrier density: $3\times10^{17}$ cm$^{-3}$) and the p-type $(Al_xGa_{1-x})_{0.51}In_{0.49}P$ ($0.7\leq x\leq1$) upper clad layer 55 (e.g., x=0.8, Zn carrier density: $5\times10^{17}$ cm$^{-3}$, thickness: 0.7 $\mu$m) are successively grown on the active layer 53. Further, the current diffusion layer 56 is grown on the upper clad layer 55.

Then, the p-type electrode 57 (e.g., Au—Zn) is formed on the current diffusion layer 56, and the n-type electrode 58 (e.g., Au—Ge) is formed under the n-type GaAs substrate 51, each by vapor deposition. The p-type electrode 57 is formed into a circular shape for example, so that a light-emitting diode is completed.

In the fifth embodiment, the active layer 53 is formed between the lower clad layer 52 and the p-type $(Al_xGa_{1-x})_yIn_{1-y}P$ ($0<x\leq0.7$, $0.65\leq y<1$) layer 54. However, it is acceptable to form an SQW active layer or an MQW active layer between the lower clad layer 52 and the p-type $(Al_xGa_{1-x})_yIn_{1-y}P$ ($0<x\leq0.7$, $0.65\leq y<1$) layer 54 instead of forming the active layer 53.

It is also acceptable to successively form a p-type lower clad layer, an active layer and an n-type upper clad layer on a substrate and provide a p-type $(Al_xGa_{1-x})_yIn_{1-y}P$ ($0<x\leq0.7$, $0.65\leq y<1$) layer between the p-type lower clad layer and the active layer.

Sixth Embodiment

A light-emitting diode which is a semiconductor light-emitting device according to a sixth embodiment of the present invention will be described with reference to FIGS. 6A and 6B.

Figure 6A:
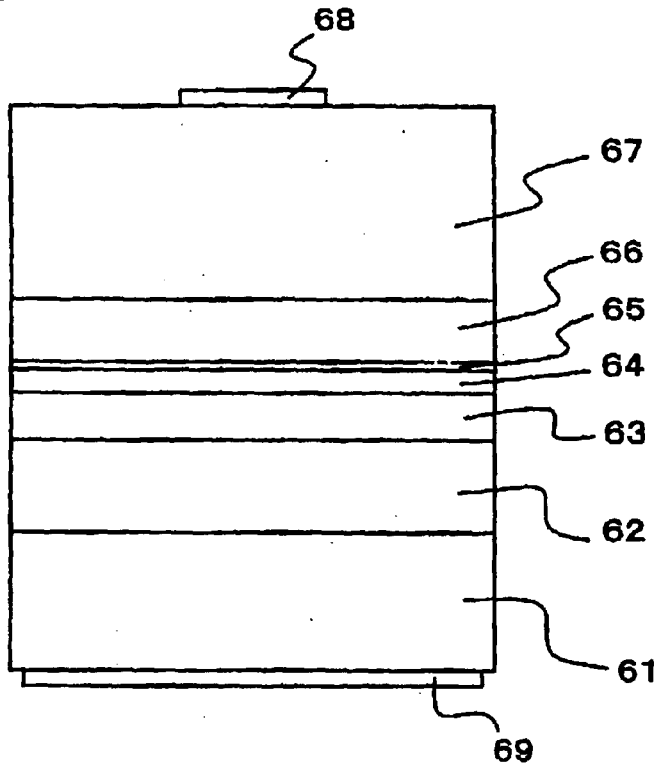
FIG. 6A is a schematic sectional view showing the construction of a semiconductor light-emitting device according to a sixth embodiment of the present invention.

As shown in FIG. 6A, the light-emitting diode is provided with an n-type $(Al_xGa_{1-x})_{0.51}In_{0.49}P$ ($0.7\leq x\leq1$) lower clad layer 62 serving as one example of the first-conductive-type clad layer, an $(Al_xGa_{1-x})_{0.51}In_{0.49}P$ ($0\leq x\leq1$) active layer 63 serving as one example of the active layer, a p-type $(Al_xGa_{1-x})_{0.51}In_{0.49}P$ ($0.7\leq x\leq1$) first upper clad layer 64 serving as one example of the first second-conductive-type clad layer and a p-type $(Al_xGa_{1-x})_{0.51}In_{0.49}P$ ($0.7\leq x\leq1$) second upper clad layer 66 serving as one example of the second second-conductive-type clad layer, which are successively formed on an n-type GaAs substrate 61 serving as one example of the compound semiconductor substrate. Then, a p-type $(Al_xGa_{1-x})_yIn_{1-y}P$ ($0<x\leq0.7$, $0.65\leq y<1$) layer 65 serving as one example of the semiconductor layer is interposed between the first upper clad layer 64 and the second upper clad layer 66.

The active layer 63 emits light that has a wavelength of not greater than 590 nm. The highest energy position at the lower end of the conduction band of this p-type $(Al_xGa_{1-x})_yIn_{1-y}P$ ($0<x\leq0.7$, $0.65\leq y<1$) layer 65 is 0.02 eV to 1.0 eV higher than the energy position at the lower end of the conduction band of the second upper clad layer 66. Moreover, in the band profile before the formation of the junctions of the first upper clad layer 64, the p-type $(Al_xGa_{1-x})_yIn_{1-y}P$ ($0<x\leq0.7$, $0.65\leq y<1$) layer 65 and the second upper clad layer 66, the energy position at the lower end of the conduction band of the p-type $(Al_xGa_{1-x})_yIn_{1-y}P$ ($0<x\leq0.7$, $0.65\leq y<1$) layer 65 is 0.05 eV to 1.0 eV higher than the energy position at the lower end of the conduction band of the second upper clad layer 66.

A current diffusion layer 67 is formed on the second upper clad layer 66, and a p-type electrode 68 is formed on this current diffusion layer 67. An n-type electrode 69 is formed under the n-type GaAs substrate 61.

Figure 6B:
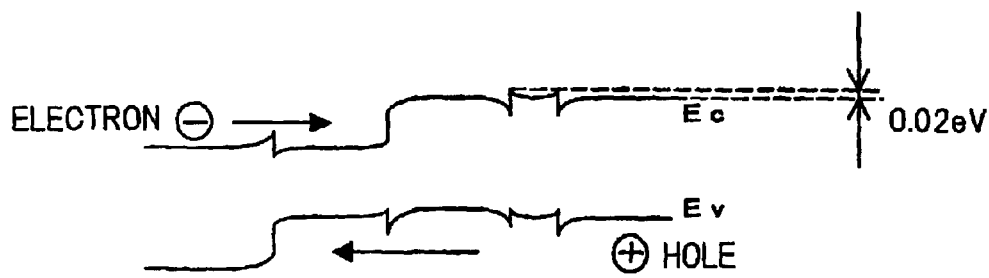
FIG. 6B is a view showing one example of a band profile in the vicinity of an active layer of the semiconductor light-emitting device.
Figure 6B:
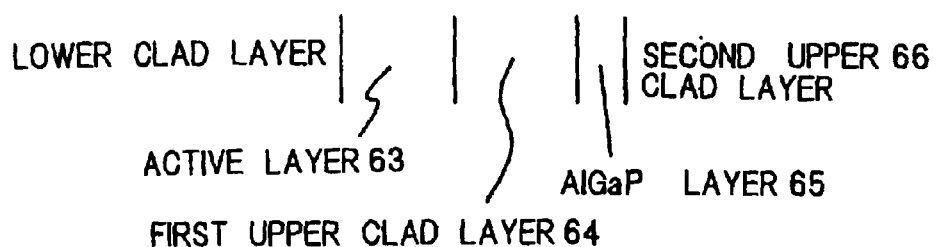

FIG. 6B shows one example of the band profile in the vicinity of the active layer 63 of the light-emitting diode of the sixth embodiment.

The light-emitting diode of the sixth embodiment has the p-type $(Al_xGa_{1-x})_yIn_{1-y}P$ ($0<x\leq0.7$, $0.65\leq y<1$) layer 65 between the first upper clad layer 64 and the second upper clad layer 66. There is energy discontinuity between the first upper clad layer 64 and the p-type $(Al_xGa_{1-x})_yIn_{1-y}P$ ($0<x\leq0.7$, $0.65\leq y<1$) layer 65. Therefore, after the first upper clad layer 64 and the p-type $(Al_xGa_{1-x})_yIn_{1-y}P$ ($0<x\leq0.7$, $0.65\leq y<1$) layer 65 are joined, there generates a notch due to energy discontinuity of about 0.05 eV difference between the first upper clad layer 64 and the p-type $(Al_xGa_{1-x})_yIn_{1-y}P$ ($0<x\leq0.7$, $0.65\leq y<1$) layer 65, where an energy barrier is formed which is about 0.02 eV higher than the lower end Ec of the conduction band of the first upper clad layer 64, as shown in FIG. 6B. This energy barrier operates as an energy barrier against the electrons supplied from the lower clad layer 62.

As described above, due to the energy barrier ascribed to the notch, the overflow of the electrons supplied from the lower clad layer 62 can be restrained further than when the p-type $(Al_xGa_{1-x})_yIn_{1-y}P$ ($0<x\leq0.7$, $0.65\leq y<1$) layer 65 does not exist. As a result, there increases the probability of radiative recombination of electrons and holes in the active layer 63, and therefore, the luminance increases further than in the prior art shown in FIG. 10.

The fabricating method of the light-emitting diode of the sixth embodiment will be described below.

First of all, as shown in FIG. 6A, the n-type $(Al_xGa_{1-x})_{0.51}In_{0.49}P$ ($0.7\leq x\leq1$) lower clad layer 62 (e.g., x=1.0, Si carrier density: $5\times10^{17}$ cm$^{-3}$, thickness: 1.0 $\mu$m), the $(Al_xGa_{1-x})_{0.51}In_{0.49}P$ ($0\leq x\leq1$) active layer 63 (e.g., x=0.45, thickness: 0.3 µm) and the p-type $(Al_xGa_{1-x})_{0.51}In_{0.49}P$ ($0.7 \leq x \leq 1$) first upper clad layer 64 (e.g., x=0.9, Zn carrier density: $5 \times 10^{17}$ cm$^{-3}$, thickness: 0.1 µm) are successively grown on the n-type GaAs substrate 61.

Subsequently, the p-type $(Al_xGa_{1-x})_yIn_{1-y}P$ ($0 < x \leq 0.7$, $0.65 \leq y < 1$) layer 65 (e.g., x=0.60, y=0.30, thickness: 150 Å, carrier density: $8 \times 10^{17}$ cm$^{-3}$) is formed on the first upper clad layer 64.

Further, the p-type $(Al_xGa_{1-x})_{0.51}In_{0.49}P$ ($0.7 \leq x \leq 1$) second upper clad layer 66 (e.g., x=0.9, Zn carrier density: $5 \times 10^{17}$ cm$^{-3}$, thickness: 1.5 µm) is grown on the p-type $(Al_xGa_{1-x})_yIn_{1-y}P$ ($0 < x \leq 0.7$, $0.65 \leq y < 1$) layer 65, and the current diffusion layer 67 is grown on the second upper clad layer 66.

Then, the p-type electrode 68 (e.g., Au—Zn) is formed on the current diffusion layer 67, and the n-type electrode 69 (e.g., Au—Ge) is formed under the n-type GaAs substrate 31, each by vapor deposition. The p-type electrode 68 is formed into a circular shape for example, so that a light-emitting diode is completed.

In the sixth embodiment, one p-type $(Al_xGa_{1-x})_yIn_{1-y}P$ ($0 < x \leq 0.7$, $0.65 \leq y < 1$) layer 65 is interposed between the first upper clad layer 64 and the second upper clad layer 66. However, it is acceptable to interpose a plurality of p-type $(Al_xGa_{1-x})_yIn_{1-y}P$ ($0 < x \leq 0.7$, $0.65 \leq y < 1$) layers between the first upper clad layer 64 and the second upper clad layer 66.

It is also acceptable to successively form a first p-type lower clad layer, a second p-type lower clad layer, an active layer and an upper clad layer on a substrate and provide a p-type $(Al_xGa_{1-x})_yIn_{1-y}P$ ($0 < x \leq 0.7$, $0.65 \leq y < 1$) layer between the first p-type lower clad layer and the second p-type lower clad layer. It is needless to say that a plurality of p-type $(Al_xGa_{1-x})_yIn_{1-y}P$ ($0 < x \leq 0.7$, $0.65 \leq y < 1$) layers may be provided between the first p-type lower clad layer and the second p-type lower clad layer.

Seventh Embodiment

A light-emitting diode which is a semiconductor light-emitting device according to a seventh embodiment of the present invention will be described with reference to FIGS. 7A, 7B and 7C.

Figure 7A:
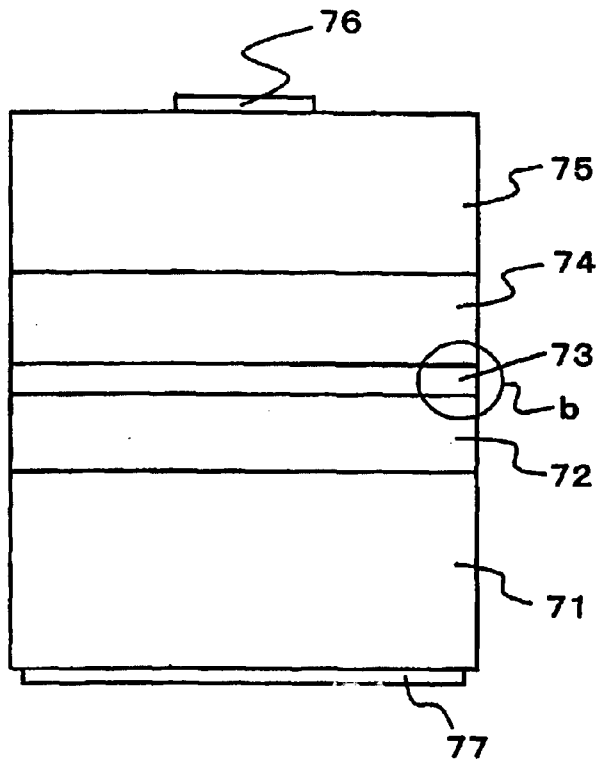
FIG. 7A is a schematic sectional view showing the construction of a semiconductor light-emitting device according to a seventh embodiment of the present invention.
Figure 7B:
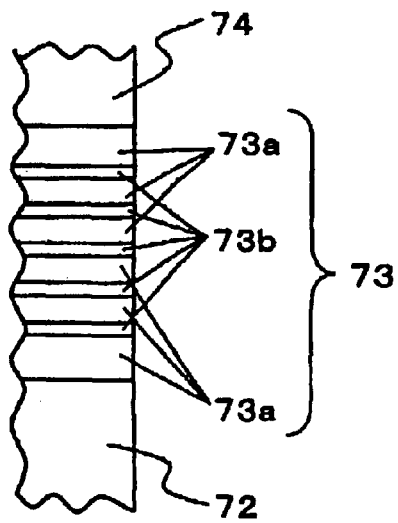
FIG. 7B is an enlarged view an essential part of FIG. 7A.

FIG. 7A is a schematic sectional view of the light-emitting diode, and FIG. 7B is an enlarged view of the inside of the circle b of FIG. 7A.

As shown in FIG. 7A, the light-emitting diode is provided with an n-type $(Al_xGa_{1-x})_{0.51}In_{0.49}P$ ($0.7 \leq x \leq 1$) lower clad layer 72 serving as one example of the first-conductive-type clad layer, an MQW active layer 73 serving as one example of the active layer and a p-type $(Al_xGa_{1-x})_{0.51}In_{0.49}P$ ($0.7 \leq x \leq 1$) upper clad layer 74 serving as one example of the second-conductive-type clad layer, which are successively formed on an n-type GaAs substrate 71 serving as one example of the compound semiconductor substrate. A current diffusion layer 75 is formed on the upper clad layer 74, and a p-type electrode 76 is formed on this current diffusion layer 75. An n-type electrode 77 is formed under the n-type GaAs substrate 71.

As shown in FIG. 7B, the MQW active layer 73 is constructed of an $(Al_xGa_{1-x})_yIn_{1-y}P$ (x=0.1, y=0.8) barrier layer 73a and an $(Al_xGa_{1-x})_yIn_{1-y}P$ ($0 \leq x \leq 1.0$, $0 \leq y \leq 1.0$) well layer 73b and emits light that has a wavelength of not greater than 590 nm. The energy position at the lower end of the conduction band from the vacuum level in all the layers of the barrier layer 73a is 0.05 eV to 1.0 eV higher than the energy position at the lower end of the conduction band from the vacuum level in the $(Al_xGa_{1-x})_yIn_{1-y}P$ (x=0.7, y=0.51).

Figure 7C:
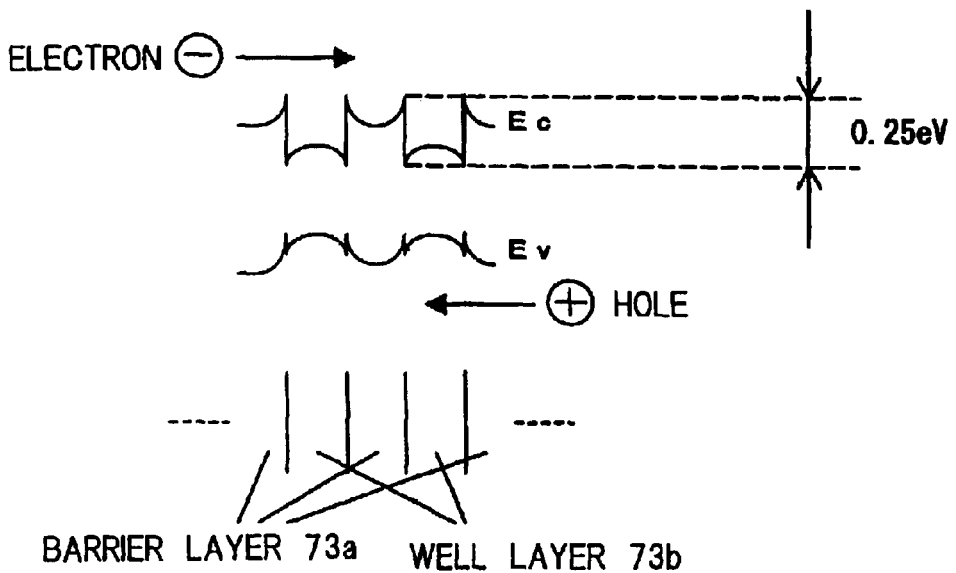
FIG. 7C is a view showing one example of a band profile in an active layer of the semiconductor light-emitting device.

FIG. 7C shows one example of the band profile in the active layer 73 of the light-emitting diode of the seventh embodiment.

The light-emitting diode of the seventh embodiment employs the $(Al_xGa_{1-x})_yIn_{1-y}P$ (x=0.1, y=0.8) barrier layer 73a. The energy difference at the lower end of the conduction band between this barrier layer 73a and the well layer 73b is larger than that between the normally employed barrier layer of $(Al_xGa_{1-x})_yIn_{1-y}P$ (x=0.7, y=0.51) and the well layer 73b. Therefore, an energy barrier of about 0.08 eV generates between the normally employed barrier layer and the well layer, whereas, in the seventh embodiment, an energy barrier of about 0.25 eV generates between the barrier layer 73a and the well layer 73b as shown in FIG. 7C. This energy barrier operates as an energy barrier against the electrons supplied from the lower clad layer 72.

As described above, due to the energy barrier of about 0.25 eV difference between the barrier layer 73a and the well layer 73b, confinement of the electrons supplied from the lower clad layer 72 into the well layer 73b is intensified, by which the overflow of electrons from the MQW active layer 73 can be restrained. As a result, there increases the probability of radiative recombination of electrons and holes in the MQW active layer 73, and therefore, the luminance increases further than in the prior art shown in FIG. 10.

The fabricating method of the light-emitting diode of the seventh embodiment will be described below.

First of all, as shown in FIG. 7A, the n-type $(Al_xGa_{1-x})_{0.51}In_{0.49}P$ ($0.7 \leq x \leq 1$) lower clad layer 72 (e.g., x=0.9, Si carrier density: $5 \times 10^{17}$ cm$^{-3}$, thickness: 0.7 µm) is grown on the n-type GaAs substrate 71, and the MQW active layer 73 is grown on the lower clad layer 72. This MQW active layer 73 is constructed by alternately growing the $(Al_xGa_{1-x})_yIn_{1-y}P$ ($0 \leq x \leq 1.0$, $0 \leq y \leq 1.0$) barrier layer 73a (e.g., x=0.1, y=0.8) and the $(Al_xGa_{1-x})_yIn_{1-y}P$ ($0 \leq x \leq 1.0$, $0 \leq y \leq 1.0$) well layer 73b (e.g., x=0.4, y=0.4) in a plurality of layers (e.g., five well layers 73b and six barrier layers 73a).

Subsequently, the p-type $(Al_xGa_{1-x})_{0.51}In_{0.49}P$ ($0.7 \leq x \leq 1$) upper clad layer 74 (e.g., x=0.8, Zn carrier density: $5 \times 10^{17}$ cm$^{-3}$, thickness: 0.7 µm) is grown on the MQW active layer 73, and the current diffusion layer 75 is grown on the upper clad layer 74.

Then, the p-type electrode 76 (e.g., Au—Zn) is formed on the current diffusion layer 75, the n-type electrode 77 (e.g., Au—Ge) is formed under the n-type GaAs substrate 71, each by vapor deposition. The p-type electrode 76 is formed into a circular shape for example, so that a light-emitting diode is completed.

In the seventh embodiment, the energy position at the lower end of the conduction band from the vacuum level in all the layers of the barrier layer 73a is 0.05 eV to 1.0 eV higher than the energy position at the lower end of the conduction band from the vacuum level in the $(Al_xGa_{1-x})_yIn_{1-y}P$ (x=0.7, y=0.51). However, the energy position at the lower end of the conduction band from the vacuum level in a part of the barrier layers 73a may be 0.05 eV to 1.0 eV higher than the energy position at the lower end of the conduction band from the vacuum level in the $(Al_xGa_{1-x})_yIn_{1-y}P$ (x=0.7, y=0.51).

Moreover, the effect of increasing the luminance can be obtained similarly to the seventh embodiment also by employing a barrier layer constructed of either one of, for example, GaP, $Al_xGa_{1-x}P$ ($0 < x \leq 0.7$) and $(Al_xGa_{1-x})_yIn_{1-y}P$ ($0 < x \leq 0.7$, $0.65 \leq y < 1$) in place of the barrier layer 73a.

It is also acceptable to successively form a p-type lower clad layer, the MQW active layer 73 and an n-type upper clad layer on a substrate.

If the active layer of the MQW structure has an SQW structure instead, the effect of increasing the luminance can be obtained similarly to the seventh embodiment.

When the barrier layer or the well layer of the MQW structure is p-type, the effect of increasing the luminance can be obtained similarly to this embodiment.

Eighth Embodiment

A light-emitting diode which is a semiconductor light-emitting device according to a eighth embodiment of the present invention will be described with reference to FIGS. 8A, 8B and 8C.

Figure 8A:
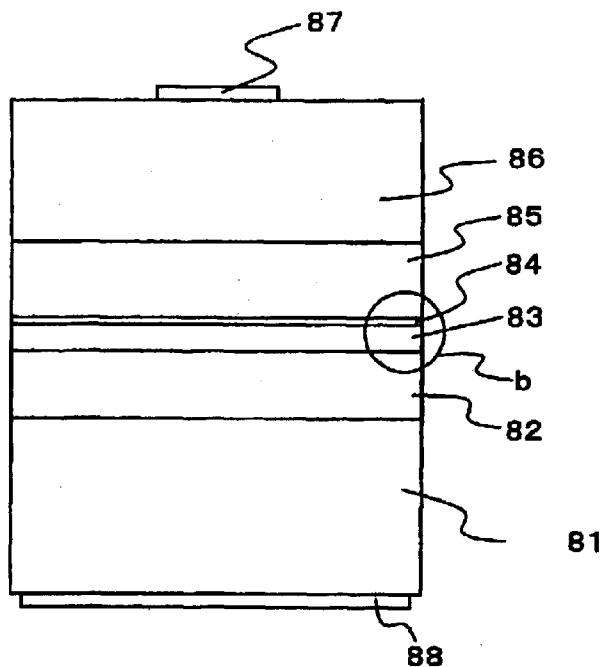
FIG. 8A is a schematic sectional view showing the construction of a semiconductor light-emitting device according to an eighth embodiment of the present invention.
Figure 8B:
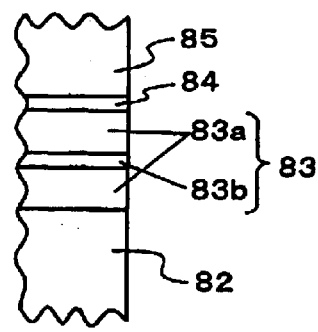
FIG. 8B is an enlarged view of an essential part of FIG. 8A.

FIG. 8A is a schematic sectional view of the light-emitting diode, and FIG. 8B is an enlarged view of the inside of the circle b of FIG. 8A.

As shown in FIG. 8A, the light-emitting diode is provided with an n-type $(Al_xGa_{1-x})_{0.51}In_{0.49}P$ ($0.7 \leq x \leq 1$) lower clad layer 82 serving as one example of the first-conductive-type clad layer, an SQW active layer 83 serving as one example of the active layer and a p-type $(Al_xGa_{1-x})_{0.51}In_{0.49}P$ ($0.7 \leq x \leq 1$) upper clad layer 85 serving as one example of the second-conductive-type clad layer, which are successively formed on an n-type GaAs substrate 81 serving as one example of the compound semiconductor substrate. Then, a p-type $Al_xGa_{1-x}P$ ($0 < x \leq 0.7$) layer 84 serving as one example of the semiconductor layer is interposed between the SQW active layer 83 and the upper clad layer 85.

The SQW active layer 83 emits light that has a wavelength of not greater than 590 nm. The highest energy position at the lower end of the conduction band of this p-type $Al_xGa_{1-x}P$ ($0 < x \leq 0.7$) layer 84 is 0.02 eV to 1.0 eV higher than the energy position at the lower end of the conduction band of the upper clad layer 85. Moreover, in the band profile before the formation of the junctions of the SQW active layer 83, the p-type $Al_xGa_{1-x}P$ ($0 < x \leq 0.7$) layer 84 and the upper clad layer 85, the energy position at the lower end of the conduction band of the p-type $Al_xGa_{1-x}P$ ($0 < x \leq 0.7$) layer 84 is 0.05 eV to 1.0 eV higher than the energy position at the lower end of the conduction band of the upper clad layer 85.

A current diffusion layer 86 is formed on the upper clad layer 85, and a p-type electrode 87 is formed on this current diffusion layer 86. An n-type electrode 88 is formed under the n-type GaAs substrate 81.

As shown in FIG. 8B, the SQW active layer 83 is constructed of an $(Al_xGa_{1-x})_yIn_{1-y}P$ ($0 \leq x \leq 1.0$, $0 \leq y \leq 1.0$) barrier layer 83a serving as one example of the barrier layer, an $(Al_xGa_{1-x})_yIn_{1-y}P$ ($0 \leq x \leq 1.0$, $0 \leq y \leq 1.0$) well layer 83b serving as one example of the well layer and an $(Al_xGa_{1-x})_yIn_{1-y}P$ ($0 \leq x \leq 1.0$, $0 \leq y \leq 1.0$) layer serving as one example of the barrier layer.

Figure 8C:
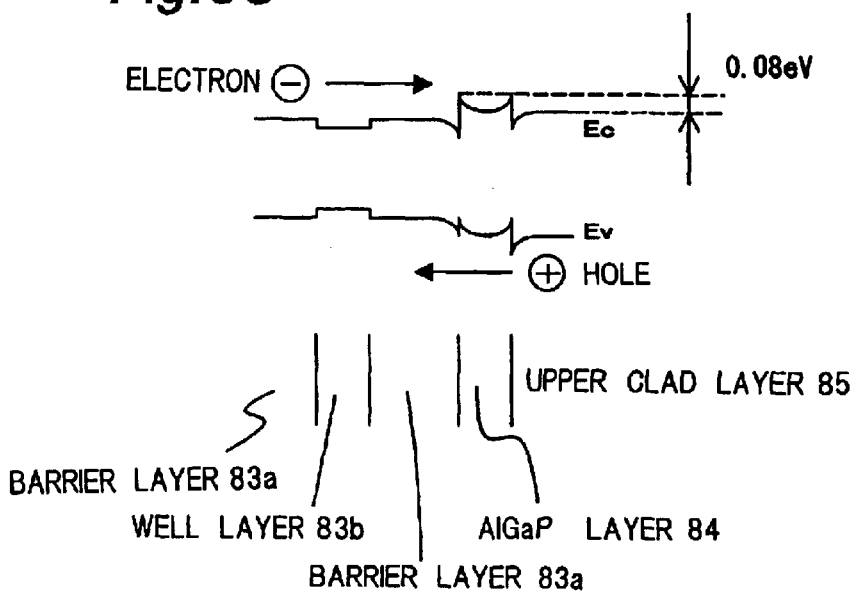
FIG. 8C is a view showing one example of a band profile in an active layer and in the vicinity of the active layer of the semiconductor light-emitting device.

FIG. 8C shows one example of the band profile in the SQW active layer 83 and in the vicinity of the SQW active layer 83 of the light-emitting diode of the eighth embodiment.

In the light-emitting diode of the eighth embodiment, the AlGaP layer 84 is formed between the barrier layer 83a located on the upper side in FIG. 8B and the upper clad layer 85. Before the p-type $Al_xGa_{1-x}P$ ($0 < x \leq 0.7$) layer 84 and the upper clad 85 are joined, the energy difference at the lower end of the conduction band between the barrier layer 83a located on the upper side in FIG. 8B and the p-type $Al_xGa_{1-x}P$ ($0 < x \leq 0.7$) layer 84 is larger than the energy difference at the lower end of the conduction band between the barrier layer 83a and the upper clad layer 85. Therefore, only an energy barrier of 0.05 eV is formed between the well layer 83a located on the upper side in FIG. 8B and the upper clad layer 85 if the p-type $Al_xGa_{1-x}P$ ($0 < x \leq 0.7$) layer 84 does not exist. However, if the p-type $Al_xGa_{1-x}P$ ($0 < x \leq 0.7$) layer 84 is formed as shown in FIG. 8C, then an energy barrier, which is about 0.08 eV higher than the energy barrier due to the upper clad layer 85, occurs. This energy barrier operates as an energy barrier against the electrons supplied from the lower clad layer 82.

As described above, due to the energy barrier between the well layer 83a located on the upper side in FIG. 8B and the upper clad layer 85, the overflow of the electrons supplied from the lower clad layer 82 can be restrained further than when the p-type $Al_xGa_{1-x}P$ ($0 < x \leq 0.7$) layer 84 does not exist. As a result, there increases the probability of radiative recombination of electrons and holes in the SQW active layer 83, and therefore, the luminance increases further than in the prior art shown in FIG. 10.

The fabricating method of the light-emitting diode of the eighth embodiment will be described below.

First of all, as shown in FIG. 8A, the n-type $(Al_xGa_{1-x})_{0.51}In_{0.49}P$ ($0.7 \leq x \leq 1$) lower clad layer 82 (e.g., x=0.9, Si carrier density: $5 \times 10^{17}$ cm$^{-3}$, thickness: 0.7 μm) is grown on the n-type GaAs substrate 81, and the SQW active layer 83 is grown on the lower clad layer 82. This SQW active layer 83 is constructed of two $(Al_xGa_{1-x})_yIn_{1-y}P$ ($0 \leq x \leq 1.0$, $0 \leq y \leq 1.0$) barrier layers 83a (e.g., x=0.55, y=0.5) and one $(Al_xGa_{1-x})_yIn_{1-y}P$ ($0 \leq x \leq 1.0$, $0 \leq y \leq 1.0$) well layer 83b (e.g., x=0.45, y=0.45).

Subsequently, the p-type $Al_xGa_{1-x}P$ ($0 < x \leq 0.7$) layer 84 (e.g., x=0.4, thickness: 250 Å, carrier density: $2 \times 10^{17}$ cm$^{-3}$) and the p-type $(Al_xGa_{1-x})_{0.51}In_{0.49}P$ ($0.7 \leq x \leq 1$) upper clad layer 85 (e.g., x=0.8, Zn carrier density: $5 \times 10^{17}$ cm$^{-3}$, thickness: 0.7 μm) are successively grown on the SQW active layer 83. Further, the current diffusion layer 86 is grown on the upper clad layer 85.

Then, the p-type electrode 87 (e.g., Au—Zn) is formed on the current diffusion layer 86, and the n-type electrode 88 (e.g., Au—Ge) is formed under the n-type GaAs substrate 81, each by vapor deposition. The p-type electrode 87 is formed into a circular shape for example, so that a light-emitting diode is completed.

Moreover, the effect of increasing the luminance can be obtained similarly to the eighth embodiment also by employing a semiconductor layer constructed of, for example, GaP or $(Al_xGa_{1-x})_yIn_{1-y}P$ ($0 < x \leq 0.7$, $0.65 \leq y < 1$) in place of the p-type $Al_xGa_{1-x}P$ ($0 < x \leq 0.7$) layer 84.

If the active layer of the SQW structure has an MQW structure instead, the effect of increasing the luminance can be obtained similarly to the eighth embodiment.

It is also acceptable to employ a barrier layer constructed of either one of, for example, GaP, $Al_xGa_{1-x}P$ ($0 < x \leq 0.7$) and $(Al_xGa_{1-x})_yIn_{1-y}P$ ($0 < x \leq 0.7$, $0.65 \leq y < 1$) in place of the barrier layer 83a.

Ninth Embodiment

A light-emitting diode which is a semiconductor light-emitting device according to a ninth embodiment of the present invention will be described with reference to FIGS. 9A, 9B and 9C.

Figure 9A:
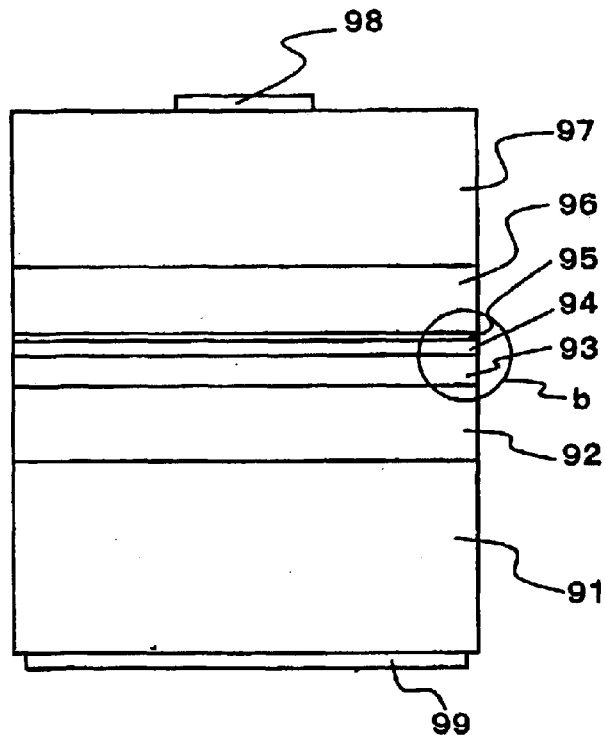
FIG. 9A is a schematic sectional view showing the construction of a semiconductor light-emitting device according to a ninth embodiment of the present invention.
Figure 9B:
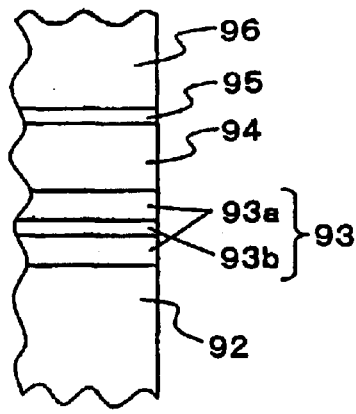
FIG. 9B is an enlarged view of an essential part of FIG. 9A.

FIG. 9A is a schematic sectional view of the light-emitting diode, and FIG. 9B is an enlarged view of the inside of the circle b of FIG. 9A.

As shown in FIG. 7A, the light-emitting diode is provided with an n-type $(Al_xGa_{1-x})_{0.51}In_{0.49}P$ ($0.7 \leq x \leq 1$) lower clad layer 92 serving as one example of the first-conductive-type clad layer, an SQW active layer 93 serving as one example of the active layer, a p-type $(Al_xGa_{1-x})_{0.51}In_{0.49}P$ ($0.7 \leq x \leq 1$) first upper clad layer 94 serving as one example of the first second-conductive-type clad layer, and a p-type $(Al_xGa_{1-x})_{0.51}In_{0.49}P$ ($0.7 \leq x \leq 1$) second upper clad layer 96 serving as one example of the second second-conductive-type clad layer, which are successively formed on an n-type GaAs substrate 91 serving as one example of the compound semiconductor substrate. Then, a p-type GaP layer 95 serving as one example of the semiconductor layer is interposed between the first upper clad layer 94 and the second upper clad layer 96.

The highest energy position at the lower end of the conduction band of this p-type GaP layer 95 is 0.02 eV to 1.0 eV higher than the energy position at the lower end of the conduction band of the second upper clad layer 96. Moreover, in the band profile before the formation of the junctions of the first upper clad layer 94, the p-type GaP layer 95 and the second upper clad layer 96, the energy position at the lower end of the conduction band of the p-type GaP layer 95 is 0.05 eV to 1.0 eV higher than the energy position at the lower end of the conduction band of the second upper clad layer 96.

A current diffusion layer 97 is formed on the second upper clad layer 96, and a p-type electrode 98 is formed on this current diffusion layer 97. An n-type electrode 99 is formed under the n-type GaAs substrate 91.

As shown in FIG. 9B, the SQW active layer 93 is constructed of an $(Al_xGa_{1-x})_yIn_{1-y}P$ ($0 \leq x \leq 1.0$, $0 \leq y \leq 1.0$) barrier layer 93a serving as one example of the barrier layer, an $(Al_xGa_{1-x})_yIn_{1-y}P$ ($0 \leq x \leq 1.0$, $0 \leq y \leq 1.0$) well layer 93b serving as one example of the well layer, and an $(Al_xGa_{1-x})_yIn_{1-y}P$ ($0 \leq x \leq 1.0$, $0 \leq y \leq 1.0$) barrier layer 93a serving as one example of the barrier layer. Then, the SQW active layer 93 emits light that has a wavelength of not greater than 590 nm.

Figure 9C:
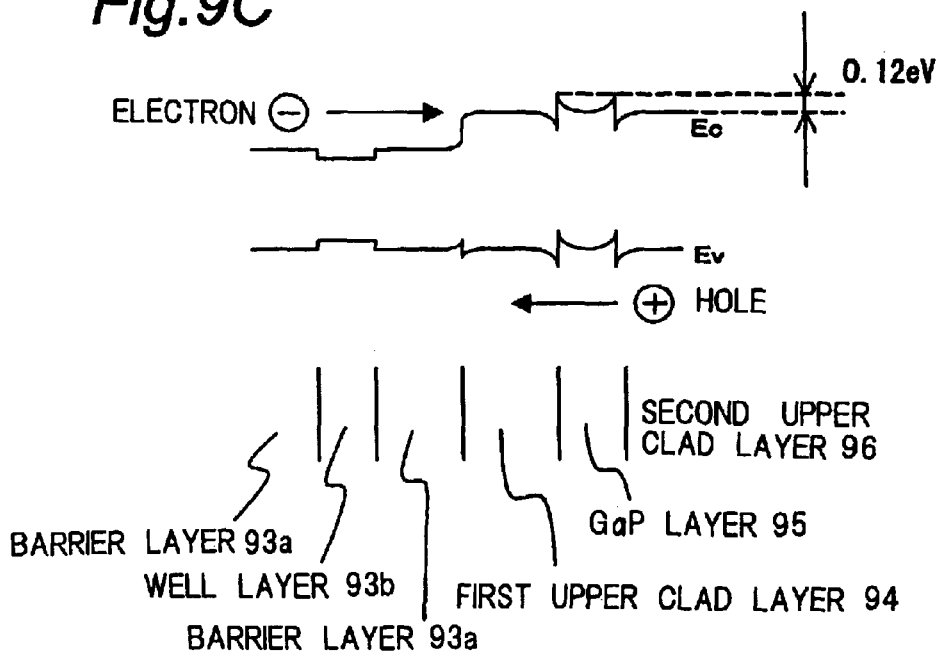
FIG. 9C is a view showing one example of a band profile in an active layer and in the vicinity of the active layer of the semiconductor light-emitting device.

FIG. 9C shows one example of the band profile in the SQW active layer 93 and in the vicinity of the SQW active layer 93 of the light-emitting diode of the ninth embodiment.

In the light-emitting diode of the ninth embodiment, the p-type GaP layer 95 is provided between the first upper clad layer 94 and the second upper clad layer 96. Before the p-type GaP layer 95 and the second upper clad layer 96 are joined, the energy difference between the lower end of the conduction band of the p-type GaP layer 95 and the lower end of the conduction band of the second upper clad layer 96 is large. Therefore, when the p-type GaP layer 95 and the second upper clad layer 96 are joined, an energy barrier generates between the first upper clad layer 94 and the second upper clad layer 96. The energy barrier due to the p-type GaP layer 95 is about 0.12 eV higher than the energy barrier due to the upper clad layer 96, as shown in FIG. 9C. This energy barrier operates as an energy barrier against the electrons supplied from the lower clad layer 92.

As described above, due to the energy barrier between the first upper clad layer 94 and the second upper clad layer 96, the overflow of the electrons supplied from the lower clad layer 92 can be restrained further than when the p-type GaP layer 95 does not exist. As a result, there increases the probability of radiative recombination of electrons and holes in the active layer 93, and therefore, the luminance increases further than in the prior art shown in FIG. 10.

The fabricating method of the light-emitting diode of the ninth embodiment will be described below.

First of all, as shown in FIG. 9A, the n-type $(Al_xGa_{1-x})_{0.51}In_{0.49}P$ ($0.7 \leq x \leq 1$) lower clad layer 92 (e.g., x=0.9, Si carrier density: $5 \times 10^{17}$ cm$^{-3}$, thickness: 0.7 $\mu$m) is grown on the n-type GaAs substrate 91, and the SQW active layer 93 is grown on the lower clad layer 92. This SQW active layer 93 is constructed of two $(Al_xGa_{1-x})_yIn_{1-y}P$ ($0 \leq x \leq 1.0$, $0 \leq y \leq 1.0$) barrier layers 93a (e.g., x=0.60, y=0.5) and one $(Al_xGa_{1-x})_yIn_{1-y}P$ ($0 \leq x \leq 1.0$, $0 \leq y \leq 1.0$) well layer 93b.

Subsequently, the p-type $(Al_xGa_{1-x})_{0.51}In_{0.49}P$ ($0.7 \leq x \leq 1$) first upper clad layer 94 (e.g., x=0.9, Zn carrier density: $4 \times 10^{17}$ cm$^{-3}$, thickness: 0.7 $\mu$m), the p-type GaP layer 95 (thickness: 60 Å, carrier density: $5 \times 10^{17}$ cm$^{-3}$) and the p-type $(Al_xGa_{1-x})_{0.51}In_{0.49}P$ ($0.7 \leq x \leq 1$) second upper clad layer 96 (e.g., x=0.8, Zn carrier density: $5 \times 10^{17}$ cm$^{-3}$, thickness: 0.7 $\mu$m) are successively grown on the SQW active layer 93. Further, the current diffusion layer 97 is grown on the second upper clad layer 96.

Then, the p-type electrode 98 (e.g., Au—Zn) is formed on the current diffusion layer 97, and the n-type electrode 99 (e.g., Au—Ge) is formed under the n-type GaAs substrate 91, each by vapor deposition. The p-type electrode 98 is formed into a circular shape for example, so that a light-emitting diode is completed.

The effect of increasing the luminance can be obtained similarly to the ninth embodiment also by employing a semiconductor layer constructed of, for example, $Al_xGa_{1-x}P$ ($0<x \leq 0.7$) or $(Al_xGa_{1-x})_yIn_{1-y}P$ ($0<x \leq 0.7$, $0.65 \leq y \leq 1$) in place of the p-type GaP layer 95,.

If the active layer of the SQW structure had an MQW structure instead, the effect of increasing the luminance was able to be obtained similarly to the ninth embodiment.

It is also acceptable to employ a barrier layer constructed of either one of, for example, GaP, $Al_xGa_{1-x}P$ ($0<x \leq 0.7$) and $(Al_xGa_{1-x})_yIn_{1-y}P$ ($0<x \leq 0.7$, $0.65 \leq y<1$) in place of the barrier layer 93a.

In the aforementioned first through ninth embodiments, there are the descriptions of the growth methods, electrode materials, electrode shapes, device configurations and so on. However, the present invention is limited to none of them and is able to be applied to all the AlGaInP-based semiconductor light-emitting devices, each of which has the DH structure where the active layer is held between the clad layers. Moreover, the present invention can similarly be applied to any such structure that the portions through which currents flow are limited or currents are blocked or constricted.

In the semiconductor light-emitting device of the aforementioned embodiments, if each of the semiconductor layers, i.e., the GaP layers 14, 25 and 95, the $Al_xGa_{1-x}P$ ($0<x \leq 0.7$) layers 34, 45 and 84 and the $(Al_xGa_{1-x})_yIn_{1-y}P$ ($0<x \leq 0.7$, $0.65 \leq y<1$) layers 54 and 65 has a thickness within a range of 10 Å to 500 Å, then the overflow of the electrons from the active layer can reliably be restrained, and the crystal defect due to lattice mismatch can be restrained.

Furthermore, if each of the semiconductor layers has a thickness within a range of 10 Å to 140 Å, then the occurrence of wafer warp ascribed to the insertion of the layer that has lattice mismatch can reliably be restrained.

As is apparent from the above, the semiconductor light-emitting device of the present invention can restrain the overflow of the electrons injected into the active layer, and therefore, there increases the probability of radiative recombination of electrons and holes in the active layer. As a result, a high-intensity semiconductor light-emitting device can be obtained.

The invention being thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light-emitting device comprising:
   a compound semiconductor substrate;
   a first-conductive-type clad layer formed on the compound semiconductor substrate;
   an active layer formed on the first-conductive-type clad layer and comprised of an AlGaInP-based semiconductor wherein light emitted from the active layer has a wavelength of not greater than 590 nm;

a second-conductive-type clad layer formed on the active layer; and a semiconductor layer interposed between the active layer and the first-conductive-type clad layer or the second-conductive-type clad layer, wherein an energy position at a lower end of a conduction band of the semiconductor layer is 0.05 eV to 1.0 eV higher than an energy position at a lower end of a conduction band of the second-conductive-type clad layer in a band profile before formation of a junction between the active layer and the semiconductor layer, and a junction between the semiconductor layer and the first-conductive-type clad layer or the second-conductive-type clad layer.

2. A semiconductor light-emitting device comprising:

a compound semiconductor substrate;

a first-conductive-type clad layer formed on the compound semiconductor substrate;

an active layer formed on the first-conductive-type clad layer and comprised of an AlGaInP-based semiconductor wherein light emitted from the active layer has a wavelength of not greater than 590 nm;

a second-conductive-type clad layer formed on the active layer; and a semiconductor layer interposed between the active layer and the first-conductive-type clad layer or between the active layer and the second-conductive-type clad layer, wherein a highest energy position at a lower end of a conduction band of the semiconductor layer is 0.02 eV to 1.0 eV higher than an energy position at a lower end of a conduction band of the second-conductive-type clad layer.

3. A semiconductor light-emitting device comprising:

a compound semiconductor substrate;

a first-conductive-type clad layer formed on the compound semiconductor substrate;

an active layer formed on the first-conductive-type clad layer and comprised of an AlGaInP-based semiconductor wherein light emitted from the active layer has a wavelength of not greater than 590 nm;

a first second-conductive-type clad layer formed on the active layer;

a second second-conductive-type clad layer formed on the first second-conductive-type clad layer; and at least one semiconductor layer interposed between the first second-conductive-type clad layer and the second second-conductive-type clad layer, wherein an energy position at a lower end of a conduction band of the semiconductor layer is 0.05 eV to 1.0 eV higher than an energy position at a lower end of a conduction band of the second second-conductive-type clad layer in a band profile before formation of a junction between the first second-conductive-type clad layer and the semiconductor layer and a junction between the semiconductor layer and second second-conductive-type clad layer.

4. A semiconductor light-emitting device comprising:

a compound semiconductor substrate;

a first-conductive-type clad layer formed on the a compound semiconductor substrate;

an active layer formed on the first-conductive-type clad layer and comprised of an AlGaInP-based semiconductor wherein light emitted from the active layer has a wavelength of not greater than 590 nm;

a first second-conductive-type clad layer formed on the active layer;

a second second-conductive-type clad layer formed on the first second-conductive-type clad layer; and at least one semiconductor layer interposed between the first second-conductive-type clad layer and the second second-conductive-type clad layer, wherein an energy position at a lower end of a conduction band of the semiconductor layer is 0.02 eV to 1.0 eV higher than an energy position at a lower end of a conduction band of the second second-conductive-type clad layer.

5. A semiconductor light-emitting device comprising:

a compound semiconductor substrate;

a first first-conductive-type clad layer formed on the compound semiconductor substrate;

a second first-conductive-type clad layer formed on the first first-conductive-type clad layer;

at least one semiconductor layer interposed between the first first-conductive-type clad layer and the second first-conductive-type clad layer;

an active layer formed on the second first-conductive-type clad layer and comprised of an AlGaInP-based semiconductor wherein light emitted from the active layer has a wavelength of not greater than 590 nm; and a second-conductive-type clad layer formed on the semiconductor layer, wherein an energy position at a lower end of a conduction band of the semiconductor layer is 0.05 eV to 1.0 eV higher than an energy position at a lower end of a conduction band of the first first-conductive-type clad layer in a band profile before formation of a junction between the first first-conductive-type clad layer and the semiconductor layer and a junction between the semiconductor layer and second first-conductive-type clad layer.

6. A semiconductor light-emitting device comprising:

a compound semiconductor substrate;

a first first-conductive-type clad layer formed on the compound semiconductor substrate;

a second first-conductive-type clad layer formed on the first first-conductive-type clad layer;

at least one semiconductor layer interposed between the first first-conductive-type clad layer and the second first-conductive-type clad layer;

an active layer formed on the second first-conductive-type clad layer and comprised of an AlGaInP-based semiconductor wherein light emitted from the active layer has a wavelength of not greater than 590 nm; and a second-conductive-type clad layer formed on the semiconductor layer, wherein an energy position at a lower end of a conduction band of the semiconductor layer is 0.02 eV to 1.0 eV higher than an energy position at a lower end of a conduction band of the first first-conductive-type clad layer.

7. The semiconductor light-emitting device as claimed in claim 1, wherein the semiconductor layer is either one of a group consisting of a GaP layer, an $Al_xGa_{1-x}P$ ($0<x\leq0.7$) layer and an $(Al_xGa_{1-x})_yIn_{1-y}P$ ($0<x\leq0.7$, $0.65\leq y<1$) layer.

8. The semiconductor light-emitting device as claimed in claim 1, wherein the semiconductor layer has a thickness range of 10 Å to 500 Å.

9. The semiconductor light-emitting device as claimed in claim 1, wherein
the semiconductor layer has a thickness range of 10 Å to 140 Å.

10. The semiconductor light-emitting device as claimed in claim 1, wherein
the active layer is an SQW active layer or an MQW active layer.

11. The semiconductor light-emitting device as claimed in claim 10, wherein
the SQW layer or the MQW layer is comprised of a plurality of barrier layers and at least one well layer, and
the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ (x=0.7, y=0.51).

12. A semiconductor light-emitting device comprising:
a compound semiconductor substrate;
a first-conductive-type clad layer formed on the compound semiconductor substrate;
an active layer formed on the first-conductive-type clad layer; and
a second-conductive-type clad layer formed on the active layerm, wherein
the active layer is an SQW active layer or an MQW active layer comprised of an AlGaInP-based semiconductor,
the SQW layer or the MQW layer is comprised of a plurality of barrier layers and at least one well layer, and
an energy position at a lower end of a conduction band from a vacuum level in part or all of the barrier layers is 0.05 eV to 1.0 eV higher than an energy position at a lower end of a conduction band from a vacuum level in $(Al_xGa_{1-x})_yIn_{1-y}P$ (x=0.7, y=0.51).

13. The semiconductor light-emitting device as claimed in claim 12, wherein
the barrier layers are either one of a group consisting of a GaP layer, an $Al_xGa_{1-x}P$ (0<x≦0.7) layer and an $(Al_xGa_{1-x})_yIn_{1-y}P$ (0<x≦0.7, 0.65≦y<1) layer.

14. The semiconductor light-emitting device as claimed in claim 1, wherein
the semiconductor layer or each of the barrier layers is the second conductive type.

15. The semiconductor light-emitting device as claimed in claim 1, wherein
the semiconductor layer or each of the barrier layers has a carrier density of $1\times10^{17}$ to $5\times10^{18}$ cm$^{-3}$.

16. The semiconductor light-emitting device as claimed in claim 1, wherein
the first conductive type is n-type, and the second conductive type is p-type.

17. The semiconductor light-emitting device as claimed in claim 2, wherein
the semiconductor layer is either one of a group consisting of a GaP layer, an $Al_xGa_{1-x}P$ (0<x≦0.7) layer and an $(Al_xGa_{1-x})_yIn_{1-y}P$ (0<x≦0.7, 0.65≦y<1) layer.

18. The semiconductor light-emitting device as claimed in claim 2, wherein
the semiconductor layer has a thickness range of 10 Å to 500 Å.

19. The semiconductor light-emitting device as claimed in claim 2, wherein
the semiconductor layer has a thickness range of 10 Å to 140 Å.

20. The semiconductor light-emitting device as claimed in claim 2, wherein
the active layer is an SQW active layer or an MQW active layer.

21. The semiconductor light-emitting device as claimed in claim 20, wherein
the SQW layer or the MQW layer is comprised of a plurality of barrier layers and at least one well layer, and
the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ (x=0.7, y=0.51).

22. The semiconductor light-emitting device as claimed in claim 2, wherein
the semiconductor layer or each of the barrier layers is the second conductive type.

23. The semiconductor light-emitting device as claimed in claim 2, wherein
the semiconductor layer or each of the barrier layers has a carrier density of $1\times10^{17}$ to $5\times10^{18}$ cm$^{-3}$.

24. The semiconductor light-emitting device as claimed in claim 2, wherein
the first conductive type is n-type, and the second conductive type is p-type.

25. The semiconductor light-emitting device as claimed in claim 3, wherein
the semiconductor layer is either one of a group consisting of a GaP layer, an $Al_xGa_{1-x}P$ (0<x≦0.7) layer and an $(Al_xGa_{1-x})_yIn_{1-y}P$ (0<x≦0.7, 0.65≦y<1) layer.

26. The semiconductor light-emitting device as claimed in claim 3, wherein
the semiconductor layer has a thickness range of 10 Å to 500 Å.

27. The semiconductor light-emitting device as claimed in claim 3, wherein
the semiconductor layer has a thickness range of 10 Å to 140 Å.

28. The semiconductor light-emitting device as claimed in claim 3, wherein
the active layer is an SQW active layer or an MQW active layer.

29. The semiconductor light-emitting device as claimed in claim 28, wherein
the SQW layer or the MQW layer is comprised of a plurality of barrier layers and at least one well layer, and
the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ (x=0.7, y=0.51).

30. The semiconductor light-emitting device as claimed in claim 3, wherein
the semiconductor layer or each of the barrier layers is the second conductive type.

31. The semiconductor light-emitting device as claimed in claim 3, wherein
the semiconductor layer or each of the barrier layers has a carrier density of $1\times10^{17}$ to $5\times10^{18}$ cm$^{-3}$.

32. The semiconductor light-emitting device as claimed in claim 3, wherein
the first conductive type is n-type, and the second conductive type is p-type.

33. The semiconductor light-emitting device as claimed in claim 4, wherein
   the semiconductor layer is either one of a group consisting of a GaP layer, an $Al_xGa_{1-x}P$ ($0<x\leqq0.7$) layer and an $(Al_xGa_{1-x})_yIn_{1-y}P$ ($0<x\leqq0.7$, $0.65\leqq y<1$) layer.

34. The semiconductor light-emitting device as claimed in claim 4, wherein
   the semiconductor layer has a thickness range of 10 Å to 500 Å.

35. The semiconductor light-emitting device as claimed in claim 4, wherein
   the semiconductor layer has a thickness range of 10 Å to 140 Å.

36. The semiconductor light-emitting device as claimed in claim 4, wherein
   the active layer is an SQW active layer or an MQW active layer.

37. The semiconductor light-emitting device as claimed in claim 36, wherein
   the SQW layer or the MQW layer is comprised of a plurality of barrier layers and at least one well layer, and
   the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ ($x=0.7$, $y=0.51$).

38. The semiconductor light-emitting device as claimed in claim 4, wherein
   the semiconductor layer or each of the barrier layers is the second conductive type.

39. The semiconductor light-emitting device as claimed in claim 4, wherein
   the semiconductor layer or each of the barrier layers has a carrier density of $1\times10^{17}$ to $5\times10^{18}$ cm$^{-3}$.

40. The semiconductor light-emitting device as claimed in claim 4, wherein
   the first conductive type is n-type, and the second conductive type is p-type.

41. The semiconductor light-emitting device as claimed in claim 5, wherein
   the semiconductor layer is either one of a group consisting of a GaP layer, an $Al_xGa_{1-x}P$ ($0<x\leqq0.7$) layer and an $(Al_xGa_{1-x})_yIn_{1-y}P$ ($0<x\leqq0.7$, $0.65\leqq y<1$) layer.

42. The semiconductor light-emitting device as claimed in claim 5, wherein
   the semiconductor layer has a thickness range of 10 Å to 500 Å.

43. The semiconductor light-emitting device as claimed in claim 5, wherein
   the semiconductor layer has a thickness range of 10 Å to 140 Å.

44. The semiconductor light-emitting device as claimed in claim 5, wherein
   the active layer is an SQW active layer or an MQW active layer.

45. The semiconductor light-emitting device as claimed in claim 44, wherein
   the SQW layer or the MQW layer is comprised of a plurality of barrier layers and at least one well layer, and
   the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ ($x=0.7$, $y=0.51$).

46. The semiconductor light-emitting device as claimed in claim 5, wherein
   the semiconductor layer or each of the barrier layers is the second conductive type.

47. The semiconductor light-emitting device as claimed in claim 5, wherein
   the semiconductor layer or each of the barrier layers has a carrier density of $1\times10^{17}$ to $5\times10^{18}$ cm$^{-3}$.

48. The semiconductor light-emitting device as claimed in claim 5, wherein
   the first conductive type is n-type, and the second conductive type is p-type.

49. The semiconductor light-emitting device as claimed in claim 6, wherein
   the semiconductor layer is either one of a group consisting of a GaP layer, an $Al_xGa_{1-x}P$ ($0<x\leqq0.7$) layer and an $(Al_xGa_{1-x})_yIn_{1-y}P$ ($0<x\leqq0.7$, $0.65\leqq y<1$) layer.

50. The semiconductor light-emitting device as claimed in claim 6, wherein
   the semiconductor layer has a thickness range of 10 Å to 500 Å.

51. The semiconductor light-emitting device as claimed in claim 6, wherein
   the semiconductor layer has a thickness range of 10 Å to 140 Å.

52. The semiconductor light-emitting device as claimed in claim 6, wherein
   the active layer is an SQW active layer or an MQW active layer.

53. The semiconductor light-emitting device as claimed in claim 52, wherein
   the SQW layer or the MQW layer is comprised of a plurality of barrier layers and at least one well layer, and
   the energy position at the lower end of the conduction band from a vacuum level in part or all of the barrier layers is 0.05 eV to 1.0 eV higher than the energy position at the lower end of the conduction band from the vacuum level in $(Al_xGa_{1-x})_yIn_{1-y}P$ ($x=0.7$, $y=0.51$).

54. The semiconductor light-emitting device as claimed in claim 6, wherein
   the semiconductor layer or each of the barrier layers is the second conductive type.

55. The semiconductor light-emitting device as claimed in claim 6, wherein
   the semiconductor layer or each of the barrier layers has a carrier density of $1\times10^{17}$ to $5\times10^{18}$ cm$^{-3}$.

56. The semiconductor light-emitting device as claimed in claim 6, wherein
   the first conductive type is n-type, and the second conductive type is p-type.

* * * * *